(12) United States Patent
Ogimoto

(10) Patent No.: US 7,114,245 B2
(45) Date of Patent: Oct. 3, 2006

(54) COMPONENT HOLDING HEAD, COMPONENT MOUNTING APPARATUS USING SAME, AND COMPONENT MOUNTING METHOD

(75) Inventor: Shinichi Ogimoto, Kanagawa-ken (JP)

(73) Assignee: Shibaura Mechatronics Corporation, Yokohama (JP)

(*) Notice: Subject to any disclaimer, the term of this patent is extended or adjusted under 35 U.S.C. 154(b) by 75 days.

(21) Appl. No.: 10/082,094

(22) Filed: Feb. 26, 2002

(65) Prior Publication Data

US 2002/0124399 A1    Sep. 12, 2002

(30) Foreign Application Priority Data

Feb. 27, 2001  (JP) ............................. P2001-52558

(51) Int. Cl.
*B23P 19/00* (2006.01)
*H05K 3/00* (2006.01)

(52) U.S. Cl. ............................. 29/739; 29/720; 29/721; 29/832; 29/833; 356/401; 356/622; 294/64.1

(58) Field of Classification Search .......... 29/DIG. 44, 29/720, 721, 738–743, 832, 833, 759; 294/2, 294/138, 164, 64.1; 356/293.2, 239.5, 401, 356/621, 622, 239.2; 228/12, 105; 901/40, 901/46, 907

See application file for complete search history.

(56) References Cited

U.S. PATENT DOCUMENTS 5,501,004 A * 3/1996 Onitsuka ..................... 29/827
6,100,922 A * 8/2000 Honda et al. ............... 356/138
6,193,132 B1 * 2/2001 Shibata et al. ............. 228/103
6,203,082 B1 * 3/2001 Bendat et al. ............. 294/64.1
6,649,926 B1 * 11/2003 Suhara et al. .......... 250/559.29

* cited by examiner

*Primary Examiner*—Minh Trinh
*Assistant Examiner*—Donghai D. Nguyen
(74) *Attorney, Agent, or Firm*—Oblon, Spivak, McClelland, Maier & Neustadt, P.C.

(57) ABSTRACT

An electronic component holding head, an electronic component mounting apparatus using same, and a method for mounting an electronic component, are provided for use in mounting an electronic component having a positioning mark formed on a film member. The electronic component holding head has a main electronic component holding unit, a vacuum chucking part facing the surface of the electronic component to be held by vacuum chucking so as to hold the electronic component, and a light path for guiding light shined onto a positioning mark formed at an edge part of the electronic component for the purpose of correcting a position offset between the electronic component and the substrate to which the electronic component is to be mounted, the vacuum chucking part holding the electronic component at a position which is on a straight line substantially parallel to an edge of the electronic component and substantially mutually orthogonal over the positioning mark of the electronic component, and which avoids the positioning mark.

13 Claims, 15 Drawing Sheets

COMPONENT HOLDING HEAD, COMPONENT MOUNTING APPARATUS USING SAME, AND COMPONENT MOUNTING METHOD

CROSS-REFERENCE TO RELATED APPLICATIONS

This application is based upon and claims the benefit of priority from the prior Japanese Patent Application No 2001-52558, filed on Feb. 27, 2001, the entire contents of which are incorporated herein by reference in its entirety.

BACKGROUND OF THE INVENTION

1. Field of the Invention

The present invention relates to a component holding head, a component mounting apparatus using same, and a method for mounting a component, and in particular relates to technology suitable for vacuum chucking and transporting an electronic component such as an IC, and mounting it onto a glass liquid-crystal substrate or the like.

2. Description of the Background Art

Research and development of electronic equipment in recent years has been dramatic and, combined with information technology (hereinafter referred to as IT) using the Internet, a diverse spectrum of products has been made of various types. In particular, R&D with regard to semiconductor technology has advanced the trend towards compact, thin and light electronic equipment and the like, and the trend for increased mobility in communications devices with on-board computers.

In the field of home television receivers as well, advances in manufacturing technology for liquid crystal panels has resulted in partial replacement of receivers using conventional color picture tube with those using large, flat screen displays featuring precision and fineness.

FIG. 1 of the accompanying drawings is a simplified view of part of an example of the manufacturing processes for a liquid crystal display device.

As shown in FIG. 1, a large number of glass substrates 2, referred to as liquid crystal substrates, onto which TFTs (thin-film transistors) are arranged in a matrix pattern, are held within a housing shelf (magazine) 1. These glass substrates 2 are picked up one at a time by a scalar-type picking robot 3, which moves in the X and Y axes, and placed on a relay table 4. A substrate 2 placed on the relay table 4 is transported to a connection member attachment apparatus 6 by a first linear-transport type substrate transporter 5.

FIG. 2 of the accompanying drawings is an enlarged oblique view of a substrate 2. As shown in FIG. 2, electrode lead 2a are formed in a line at the terminal parts of the periphery of the substrate 2. An anisotropic conductive film (ACF, not shown in the drawing) connection member-or the like is attached by the connection member attachment apparatus 6 to the lead 2a of the substrate 2 that has been transported to the connection member attachment apparatus 6.

Returning to FIG. 1, after attachment by the connection member attachment apparatus 6 of the connection members to the lead 2a, the substrate 2 is transported by a second linear-transport type substrate transporter 7 to a component mounting apparatus 8. At the component mounting apparatus 8, electronic components such as tape carrier packages (TCPs) are positioned above the connection members, after which connection and mounting is finished by hot pressing.

FIG. 3 of the accompanying drawings is an enlarged oblique view of an electronic component 9 in FIG. 2, viewed from the bottom thereof. As shown in FIG. 3, a chip component 92 such as an IC is connected and mounted to the lower surface of a transparent film member 91 of the electronic component 9, a large number of leads 91a being connected and formed in an arrangement in which each opposes electrodes of the chip component 92 at the terminal parts of the film member 91.

Positioning marks 91b, 91b are formed as a patterned pair along the edge of the film member 91 on both outer sides of the terminal parts of the film member 91, so as to surround the lead 91a therebetween. As shown in FIG. 2, positioning marks 2b, 2b are formed at positions corresponding to the positioning marks 91b, 91b on the substrate 2 on which the electronic components 9 are mounted.

Returning to FIG. 1, in the condition in which the electronic component 9 is held by vacuum suction by a component holding head at the component mounting apparatus 8, an imaging device images the electronic component 9 positioning marks 91b and substrate 2 positioning marks 2b. Position correction is performed with respect to both of these, so as to make the amount of relative offset between the electronic component 9 positioning marks 91b and substrate 2 positioning marks 2b zero, based on the image data, as the electronic component 9 is positioned at a prescribed location on the substrate 2, hot-pressing by the component holding head with a built-in heater being used to mount the electronic component 9 to the substrate 2.

The film member 91, which is the base material of the electronic component 9, is a polyimide resin or the like, onto which the lead 91a and positioning marks 91b are formed as copper foil patterns or gilded copper foil patterns. Whereas the polyimide resin base material has a green, brown or orange coloration, the positioning marks 91b and the like, being provided as copper foil or gilded copper foil, make it possible to obtain only a small color gradation difference relative to the positioning marks 91b and the film member 91.

Because there is only a small difference in color gradation between the positioning marks 91b and the base material, if the imaging device images the positioning mark 91b using reflected light, insufficient contrast (intensity ratio) is achieved between the positioning mark 91b and the base material. For this reason, in many component mounting apparatuses the imaging device uses light that is shone onto the positioning mark from the opposite side and passed therethrough to form an image of the terminal part of the electronic component 9.

FIG. 4 is a front elevational view showing a component mounting apparatus 8, this being the type of component mounting apparatus 8 of FIG. 1 in which transmitted light is used to form an image of the terminal part of an electronic component 9. As shown in FIG. 4, in this component mounting apparatus 8, the component holding head 81, which vacuum chucks and transports the electronic component 9, is mounted to a transport arm 83, formed by an X-Y coordinate robot, via the actuating rod 82a of a cylinder 82.

A glass substrate 2 is placed on a substrate placement stage 84 below the component holding head 81, and the substrate placement stage 84 itself is configured so as to be able to move in the horizontal plane and rotationally.

After being placed on the table 85, the electronic component 9 is vacuum chucked to the component holding head 81 and transported to over the terminal part of the substrate 2, whereupon a controller 86 having a built-in microcomputer performs relative positioning control between the electronic component 9 and the substrate 2.

The imaging device 87, which forms images of the electronic component 9 and the terminal parts on the substrate 2, is disposed on and fixed over the substrate 2 and component holding head 81.

FIG. 5 is an enlarged view showing the positional relationship between the imaging device 87, the component holding head 81, and specific parts of the substrate 2. As shown in FIG. 5, the imaging device 87 transmits light emanating from an illumination fixture (light source) 88 disposed below the substrate 2. The transmitted light is used to simultaneously form images of the positioning marks 2b and 91b of the substrate 2 and electronic component 9, respectively. In the case in which the substrate 2 is formed from an opaque material, an illumination fixture 88 such as a lamp that shines light towards the substrate 2 is, for example, built into the imaging device 87, the reflected light thereof being used to obtain a picture signal of the terminal part of the substrate 2, that is, image data of the positioning mark 2b.

The image data of each of the positioning marks 2b and 91b obtained by the imaging device 87 are supplied to the controller 86 shown in FIG. 4, and pattern recognition or the like is used to detect the relative position offset. The controller 86 performs control of the transport arm 83 and the substrate placement stage 84 and the like so that this amount of position offset is made zero. By alignment of the relative positions of the positioning marks 2b and 91b, the lead 2a and 91a are made so as to correspond and to connect to each other.

In FIG. 5, a single imaging device 87 is shown forming an image of the positioning marks 91b and 2b of one of the electronic component 9 and the substrate 2. In reality, another separate imaging device 87 is provided so as to form images of the positioning marks 91b and 2b of the other of the electronic component 9 and substrate 2, each of these image data being supplied to the controller 86 for performing positioning control.

The lead 91a of the electronic component 9 and the lead 2a of the substrate 2 are positioned so that they are brought into mutual correspondence. After this is done, the controller 86 performs movement control of the receiving stage 89 in the directions of the arrows X and Z in FIG. 4 and FIG. 5, and controls the cylinder 82 so that it lowers the component holding head 81. The positioned electronic component 9, therefore, is pressed up against the substrate 2 supported by the receiving stage 89, via a connection member, and a mounting and connection is made by heating.

FIG. 6 is a cross-sectional view showing the condition in which block-type three-dimensional component holding head 81 is vacuum-chuck holding an electronic component 9 in the configuration shown in FIG. 4 and FIG. 5. FIG. 7 is a cross-sectional view from the direction of the arrows of line VII—VII in FIG. 6. As shown in FIG. 6 and FIG. 7, a vacuum chucking hole 81a of the component holding head 81 is provided so as to open toward the vacuum chucking surface. The vacuum chucking hole 81a is connected, via a pipe 81b, to a vacuum pump (not shown in the drawing) having an electromagnetic valve. The vacuum chucking and releasing of the electronic component 9 at the vacuum chucking hole 81a are done by valve control performed by the controller 86.

As shown in FIG. 4 and FIG. 5, in order for the imaging device 87 to obtain image data of the positioning mark 91b, it is necessary to cause light from the illumination fixture 88 to be transmitted through the terminal part of the electronic component. For this reason, the component holding head 81 holds the electronic component 9 by vacuum chucking, avoiding the edges of the terminal parts of the electronic component 9 at which the positioning mark 91b is disposed.

The base material of the electronic component 9 that is vacuum chuck held by the component holding head 81 is a film member 91 made of polyimide resin or the like. Because the desire for smaller and lighter components, however, has resulted in thinner film members 91, it is easy to change its shape. As shown by the broken line in FIG. 6, downward sagging or recurvation occurs at the terminal parts of the film member 91 not vacuum chuck held by the component holding head 81. Therefore, as shown in FIG. 8, there is deformation at the imaged positioning mark 91b part and connected lead 91a, preventing the achievement of parallelness between these deformed parts and the substrate 2 to which these are to be connected.

In FIG. 5 and FIG. 6, the reference numeral 81c denotes a heater built into the component holding head 81. The positioning marks 2b and 91b are shown as rectangles in FIG. 2, FIG. 3, FIG. 5, and FIG. 7, but can alternatively be cross-shaped or have other shapes.

As described above, a component mounting apparatus had the following problems. Specifically, as shown in FIG. 4 and FIG. 5, the imaging device 87 forms an image of the terminal part of the electronic component 9 using the light passing from the illumination fixture 88 positioned on the opposite side of the electronic component 9 (downward side in the drawing), and the controller 86 performs control, based on this image data, so that the position offset is compensated.

As shown in FIG. 6 and FIG. 8, however, the block-shaped component holding head 81 vacuum chuck holds the electronic component 9 at a location on the inside thereof, so as to avoid the edge of the film member 91. For this reason, deformation occurs, such as downward sagging or recurvation of the terminal part of the electronic component 9. A position offset therefore occurs between the position on the image screen of the positioning mark 91b imaged from directly above and the position of the positioning mark 91b which should be opposite the actual positioning mark 2b of the substrate 2. If the positioning mark 91b of the electronic component 9 is imaged for the purpose of positioning when it is in the deformed condition and the electronic component 9 is mounted onto the substrate 2 based on the image data obtained in that condition, there is a risk of misalignment occurring, and not achieving a good electrical connection.

Substrates 2 seen recently have not only thinner film members 91, but also a very narrow pitch between the lead 91a. For this reason, with the need to achieve high positioning accuracy, misalignment is a major hindrance to achieving a high yield in manufacturing liquid crystal panels, and there is a desire to achieve an improvement in this situation.

SUMMARY OF THE INVENTION

Accordingly, the present invention was made for the purpose of solving the above-described technological problems, and has as an object to provide a component holding head capable of positioning of an electronic component with high accuracy, a component mounting apparatus using this component holding head, and a method for mounting components, which, in positioning an electronic component for mounting onto a substrate, avoid downward sagging and bending or the like of the edge part of an electronic component held by the component holding head of a mounting apparatus.

An aspect of the present invention is an electronic component holding head for holding an electronic component to be mounted to a substrate, comprising: a main electronic component holding unit; a vacuum chucking part provided on said main electronic component holding unit so as to face the surface of the electronic component to be held by vacuum chucking, so that the electronic component is held by vacuum chucking to said main electronic component holding unit; and a light path part formed in a terminal part of the electronic component, which guides light shined onto a positioning mark for correcting a position offset between the electronic component and a substrate to which the electronic component is to be mounted, wherein said vacuum chucking part holds the electronic component at a position which is on straight lines substantially parallel to an edge of the electronic component and substantially mutually orthogonal on or over the positioning mark of the electronic component, and which avoids the positioning mark.

Another aspect of the present invention is an electronic component holding head for holding an electronic component to be mounted to a substrate, comprising:

a main electronic component holding unit; a vacuum chucking part provided on said main electronic component holding unit so as to face the surface of the electronic component to be held by vacuum chucking, so that the electronic component is held by vacuum chucking to said electronic component main holding unit; and a light path part formed in a terminal part of the electronic component, which guides light shined onto a positioning mark for correcting a position offset between the electronic component and a substrate to which the electronic component is to be mounted, wherein said vacuum chucking part holds the electronic component at a position which is on a straight line traversing the positioning mark of the electronic component and which avoids the positioning mark on or over the positioning mark of the electronic component.

Another aspect of the present invention is an electronic component mounting apparatus for mounting an electronic component onto a substrate, comprising: an electronic component feeding unit, which feeds an electronic component; an electronic component holding head, which holds the electronic component to be mounted onto a substrate; an imaging unit, which forms an image of a positioning mark formed at a terminal part of the electronic component held by said electronic component holding head, for correcting a position offset between the electronic component and the substrate to which the electronic component is to be mounted; a position offset detection unit, which detects a position offset of the electronic component relative to the substrate, based on image data of the positioning mark obtained by said imaging unit; a position correction unit which, based on the position offset detected by said position offset detection unit, performs control so as to correct the X direction and the Y direction position offset of the electronic component relative to the substrate, so that the electronic component with the thus corrected position offset is mounted to the substrate, wherein said electronic component holding head includes: a main electronic component holding unit; a vacuum chucking part provided on said main electronic component holding unit so as to face the surface of the electronic component to be held by vacuum chucking, so that the electronic component is held by vacuum chucking to said main electronic component holding unit; and a light path part formed in a terminal part of the electronic component, which guides light shined onto the positioning mark for correcting a position offset between the electronic component and the substrate to which the electronic component is to be mounted, wherein said vacuum chucking part holds the electronic component at a position which is on straight lines substantially parallel to an edge of the electronic component and substantially mutually orthogonal over the positioning mark of the electronic component, and which avoids the positioning mark.

Another aspect of the present invention is an electronic component mounting apparatus for mounting an electronic component onto a substrate, comprising: an electronic component feeding unit, which feeds an electronic component; an electronic component holding head, which holds an electronic component to be mounted onto a substrate; an imaging unit, which forms an image of a positioning mark formed at a terminal part of the electronic component held by said electronic component holding head, for correcting a position offset between the electronic component and the substrate to which the electronic component is to be mounted; a position offset detection unit, which detects a position offset of the electronic component relative to the substrate, based on image data of the positioning mark obtained by said imaging part; a position correction unit which, based on the position offset detected by said position offset detection unit, performs control so as to correct the X direction and the Y direction position offset of the electronic component relative to the substrate, so that the electronic component with the thus corrected position offset is mounted to the substrate, wherein said electronic component holding head includes: a main electronic component holding unit; a vacuum chucking part provided on said main electronic component holding unit so as to face the surface of the electronic component to be held by vacuum chucking, so that the electronic component is held by vacuum chucking to said main electronic component holding unit; and a light path part formed in a terminal part of the electronic component, which guides light shined onto the positioning mark for correcting a position offset between the electronic component and the substrate to which the electronic component is to be mounted, wherein said vacuum chucking part holds the electronic component at a position which is on a straight line traversing the positioning mark of the electronic component and which avoids the positioning mark over the positioning mark of the electronic component.

Another aspect of the present invention is a method of mounting an electronic component to a substrate, comprising: feeding an electronic component; forming an image of a positioning mark for compensation of a position offset between the electronic component and the substrate to which the electronic component is to be mounted; detecting a position offset of the electronic component relative to the substrate, based on the image data of the positioning mark; correcting the X direction and Y direction position offset of the electronic component relative to the substrate, based on the detected position offset; and holding a position offset corrected electronic component by said electronic component holding head and mounting the electronic component to the substrate, wherein said electronic component holding head includes: a main electronic component holding unit; a vacuum chucking part provided on said main electronic component holding unit so as to face the surface of the electronic component to be held by vacuum chucking, so that the electronic component is held by vacuum chucking to said main electronic component holding unit; and a light path part formed in a terminal part of the electronic component, which guides light shined onto the positioning mark for correcting a position offset between the electronic component and the substrate to which the electronic component is to be mounted, wherein said vacuum chucking part holds the electronic component at a position which is on straight lines substantially parallel to an edge of the electronic component and substantially mutually orthogonal on or over the positioning mark of the electronic component, and which avoids the positioning mark.

Another aspect of the present invention is a method of mounting an electronic component to a substrate, comprising: feeding an electronic component; forming an image of a positioning mark for compensation of a position offset between the electronic component and the substrate to which the electronic component is to be mounted; detecting a position offset of the electronic component relative to the substrate, based on the image data of the positioning mark; correcting the X direction and Y direction position offset of the electronic component relative to the substrate, based on the detected position offset; and holding an electronic component to be position offset corrected by said electronic component holding head and mounting the electronic component to the substrate, wherein said electronic component holding head includes: a main electronic component holding unit; a vacuum chucking part provided on said main electronic component holding unit so as to face the surface of the electronic component to be held by vacuum chucking, so that the electronic component is held by vacuum chucking to said main electronic component holding unit; and a light path part formed in a terminal part of the electronic component, which guides light shined onto the positioning mark for correcting a position offset between the electronic component and the substrate to which the electronic component is to be mounted, wherein said vacuum chucking part holds the electronic component at a position which is on straight lines substantially parallel to an edge of the electronic component and substantially mutually orthogonal on or over the positioning mark of the electronic component, and which avoids the positioning mark.

Other features and advantages of the present invention will become apparent from the following description taken in conjunction with the accompanying drawings.

BRIEF DESCRIPTION OF THE DRAWING

The above and other features will be better understood from the exemplary embodiments described below, taken together with the drawings, of which.

DETAILED DESCRIPTION OF THE PREFERRED EMBODIMENTS

Figure 1:
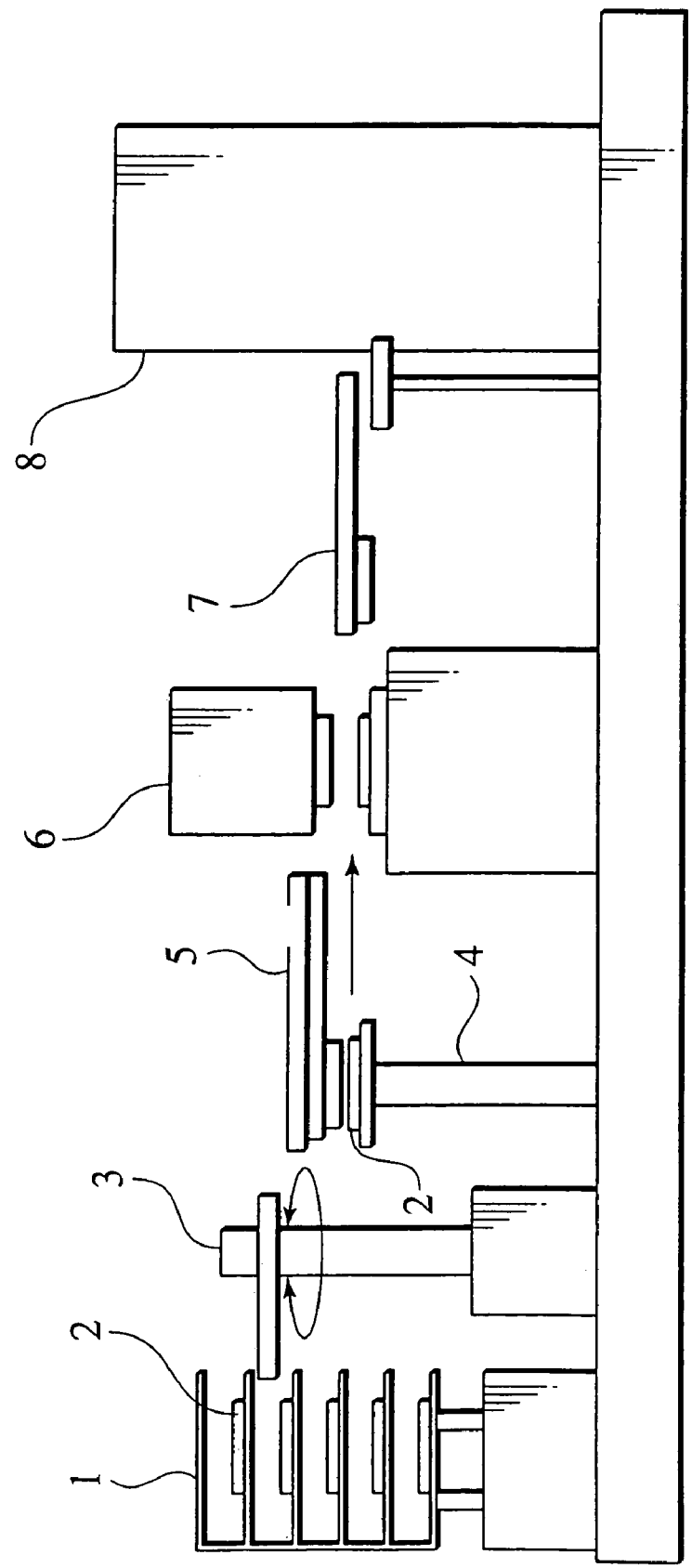
FIG. 1 is a simplified drawing showing part of an example of a liquid crystal display device manufacturing process.
Figure 2:
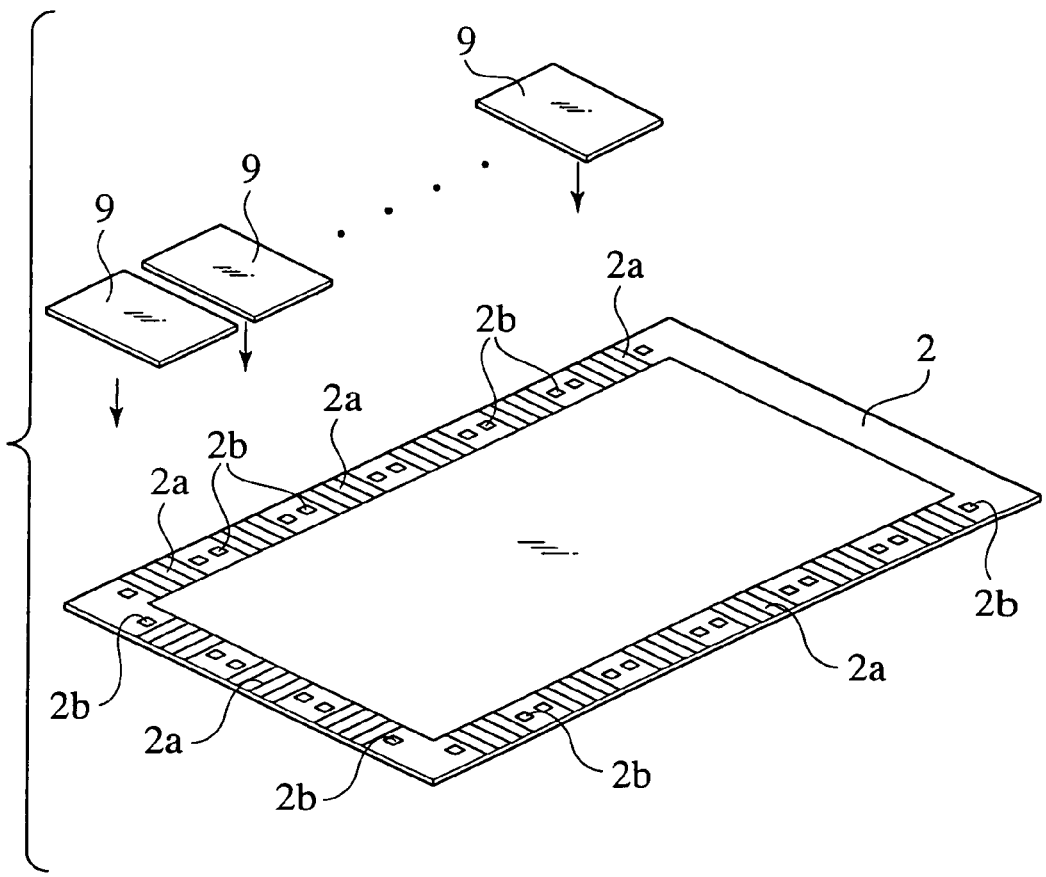
FIG. 2 is an enlarged oblique view of the substrate 2 in FIG. 1.
Figure 3:
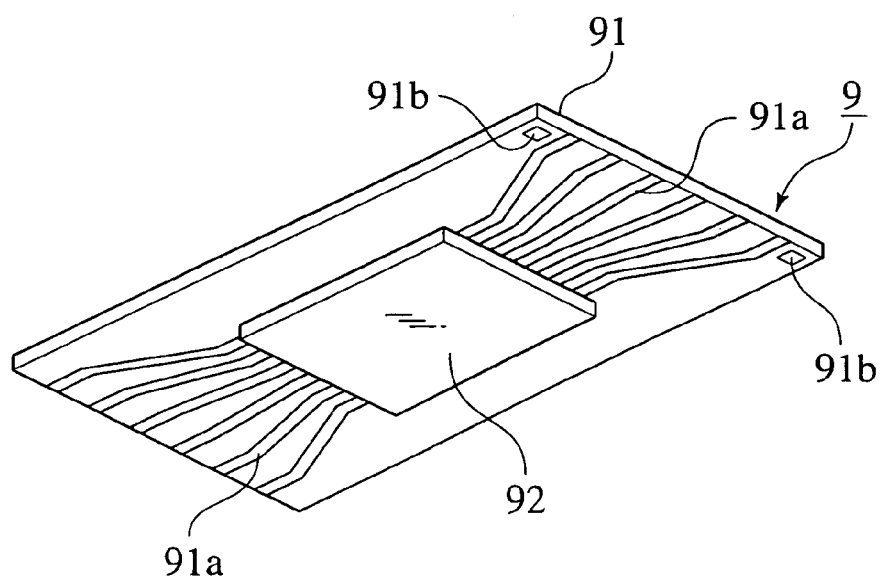
FIG. 3 is an enlarged oblique view from beneath an example of an electronic component 9 in FIG. 2.
Figure 4:
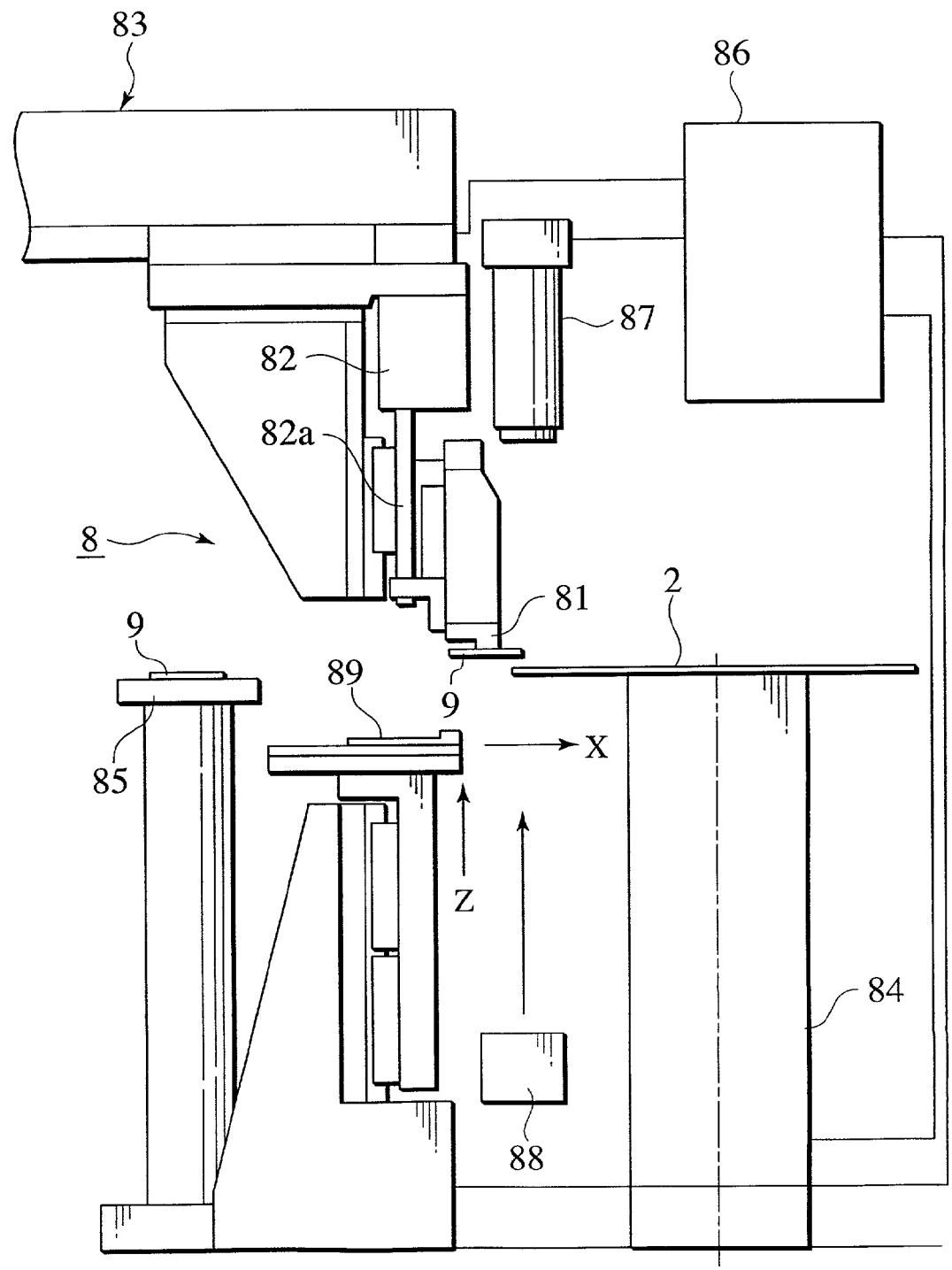
FIG. 4 is a front elevational view showing a component mounting apparatus 8, this being the type of component mounting apparatus in which transmitted light is used to form an image of an electronic component 9.
Figure 5:
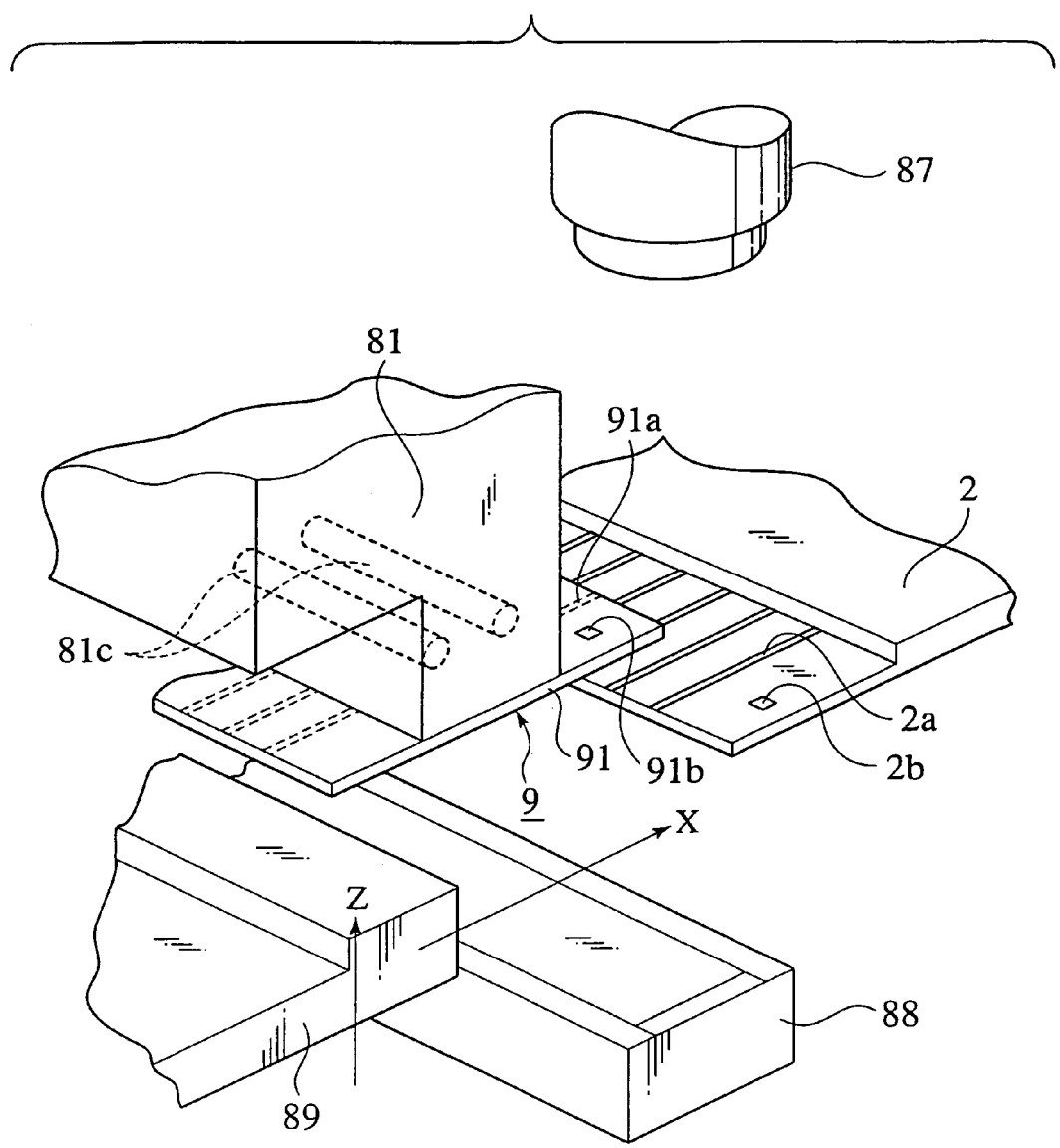
FIG. 5 is an enlarged view showing the positional relationship between the imaging device 87, the component holding head 81, and specific parts of the substrate 2.
Figure 6:
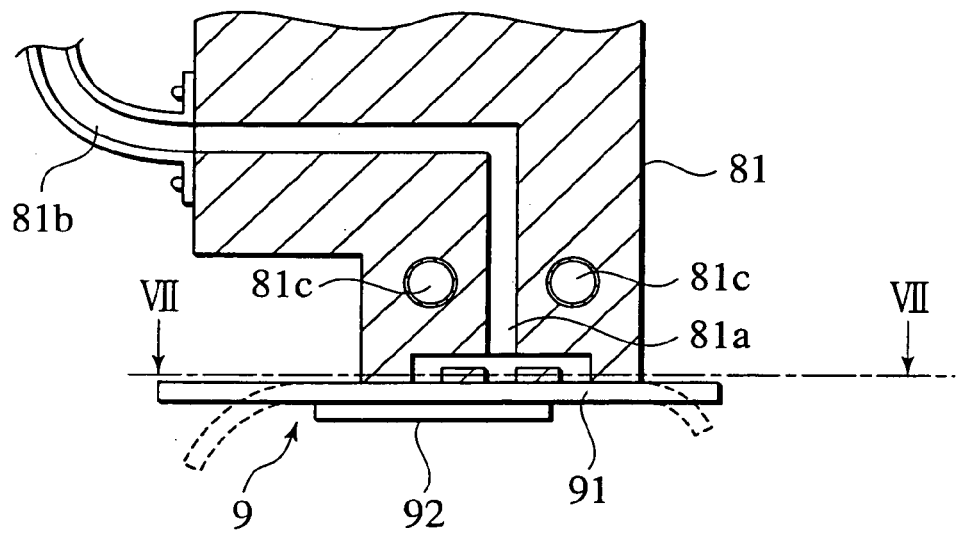
FIG. 6 is a cross-sectional view showing the condition in which component block-type three-dimensional holding head 81 is vacuum-chuck holding an electronic component 9 in the configuration shown in FIG. 4 and FIG. 5.
Figure 7:
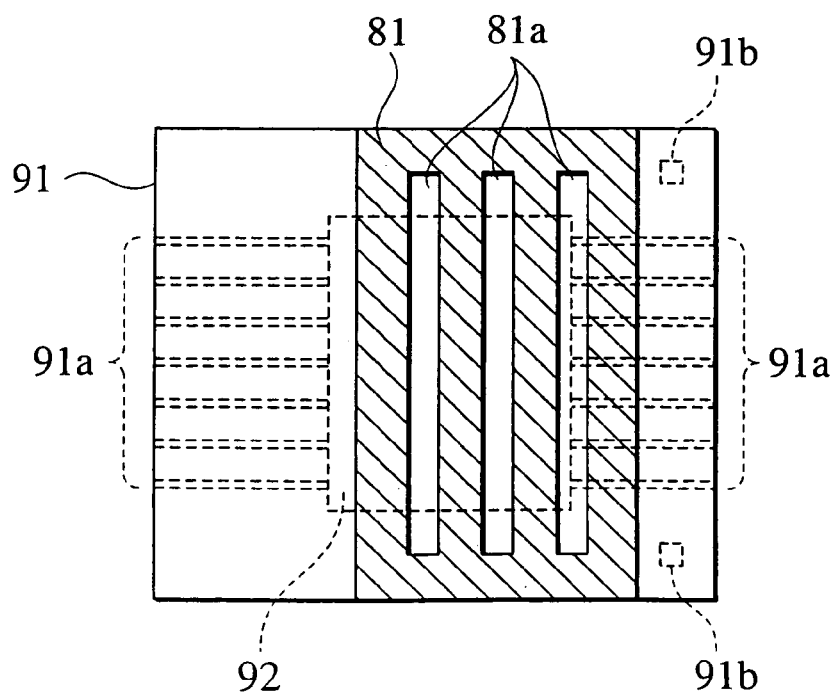
FIG. 7 is a cross-sectional view from the direction of the arrows of line VII—VII in FIG. 6.
Figure 8:
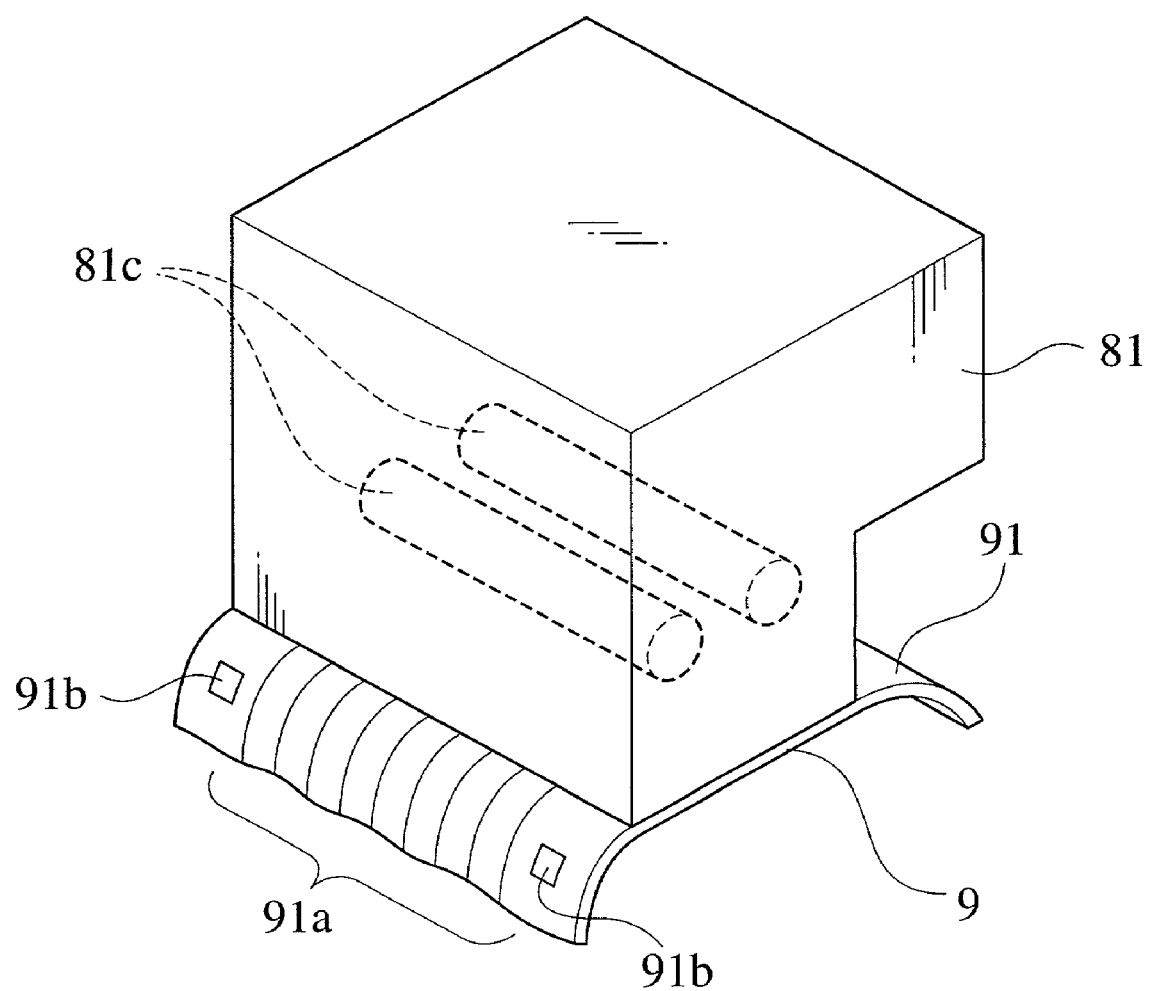
FIG. 8 is a drawing showing the condition in which the imaged positioning mark 91b and lead 91a part to be connected are deformed.

Embodiments of the present invention are described in detail below, with reference made to relevant accompanying drawings.

First Embodiment

A component holding head according to a first embodiment of the present invention, a component mounting apparatus using same, and a method for mounting a component are illustrated in FIG. 9 through FIG. 14, and described below in detail.

The first embodiment provides a component holding head, a component mounting apparatus using same, and a method for mounting components, wherein in a component holding head holding an electronic component for mounting the component onto a substrate, deformation of a positioning mark on the electronic component while the component holding head holds the electronic component for the purpose of mounting is suppressed, whereby it is possible to obtain a large, well-contrasted, clear, and accurate positioning mark by an imaging device using transmitted light.

In the description to follow, elements similar to elements in the component holding head and component mounting apparatus using same shown in FIG. 1 through FIG. 8 are assigned the same reference numerals, and are not described in detail herein.

Figure 9:
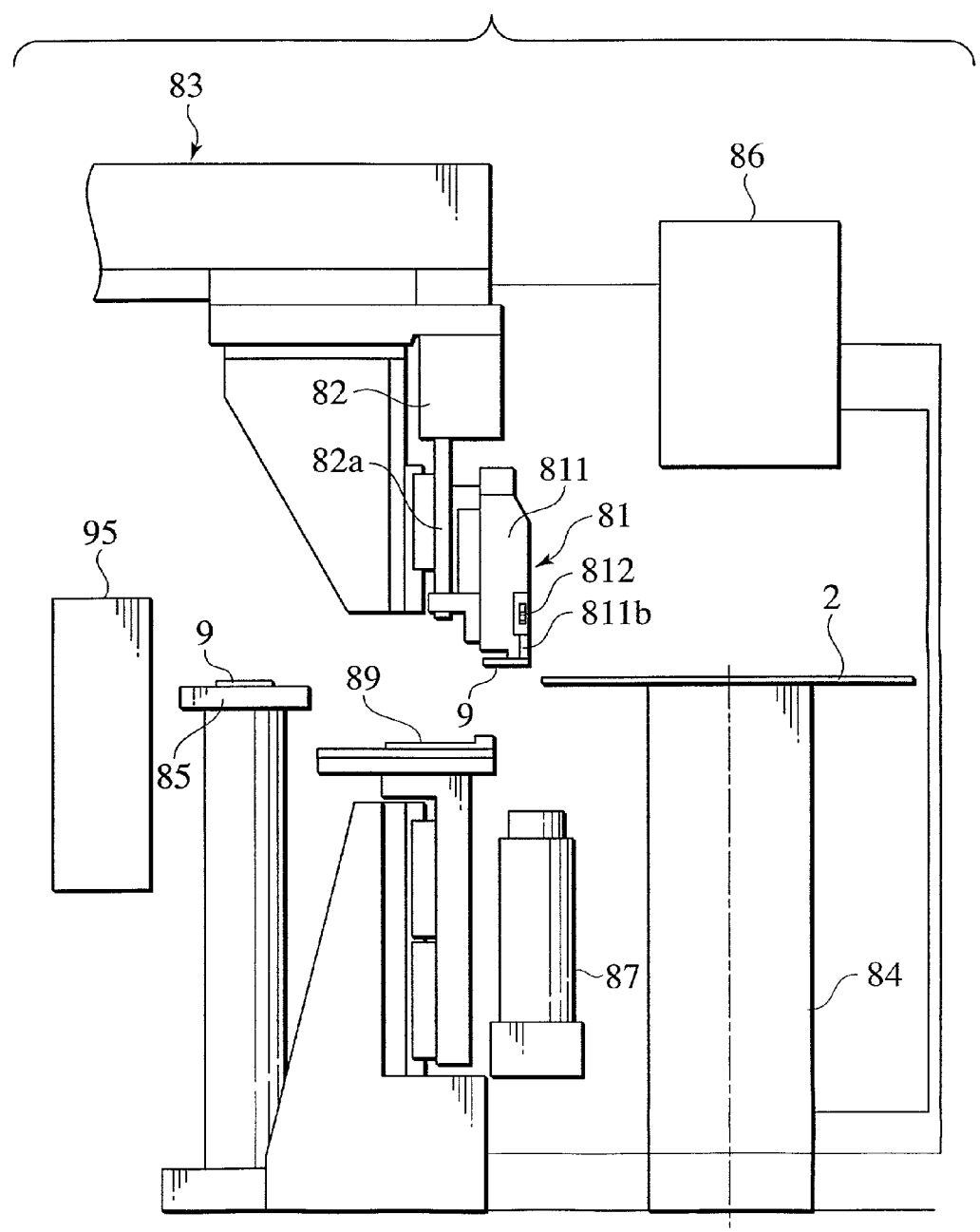
FIG. 9 is a front elevational view showing the a component mounting apparatus to which a component holding head according to a first embodiment of the present invention has been applied.

FIG. 9 is a front elevational view showing the a component mounting apparatus having a component holding head according to the first embodiment.

In the apparatus illustrated in FIG. 9, a component holding head 81 vacuum chuck holds and transports an electronic component 9 supplied from an electronic component feeding apparatus 95 and located on the table 85, and is in the form of a three-dimensional block. This component holding head 81 is mounted to transport arm 83 via an actuating rod 82a of a cylinder 82. In this case, the component holding head 81 will be taken as freely moving in the X-Y direction and rotationally, by means of the transport arm 83.

The component holding head 81 has a main holding unit 811, a illumination fixture (light source) 812, and a cutout part 811b. A controller 86 detects a position offset between the electronic component 9 and the substrate 2, and performs movement control of the transport arm 83 and a substrate placement stage 84, so as to compensate the position offset.

A glass substrate (liquid crystal substrate) 2 is placed on the substrate placement stage 84 at the bottom part of FIG. 9. After relative positioning of the electronic component 9 vacuum chuck held and transported by the component holding head 81 relative to the substrate 2, it is mounted onto the substrate 2, which is for example a liquid crystal substrate or the like.

Figure 10:
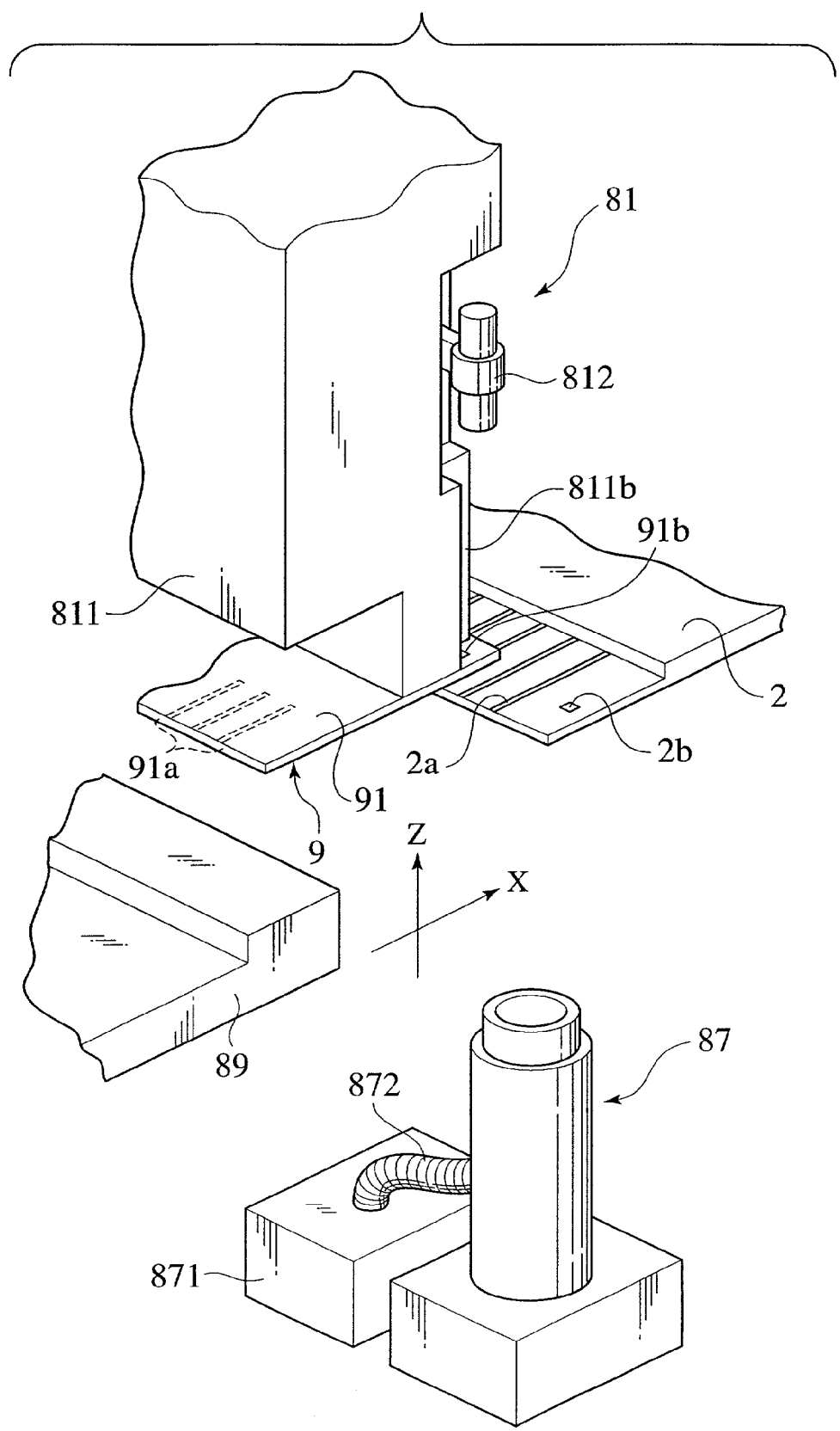
FIG. 10 is an enlarged oblique view showing the configuration of the main part of the component holding head of FIG. 9.

FIG. 10 is an enlarged oblique view showing the configuration of the main part of the component mounting apparatus shown in FIG. 9.

For the purpose of positioning between the electronic component 9 and the substrate 2, an imaging device 87, such as a CCD camera or the like, is disposed below the component holding head 81. On the substrate 2, a positioning mark 2b and lead 2a are disposed at the terminal parts thereof.

Figure 11:
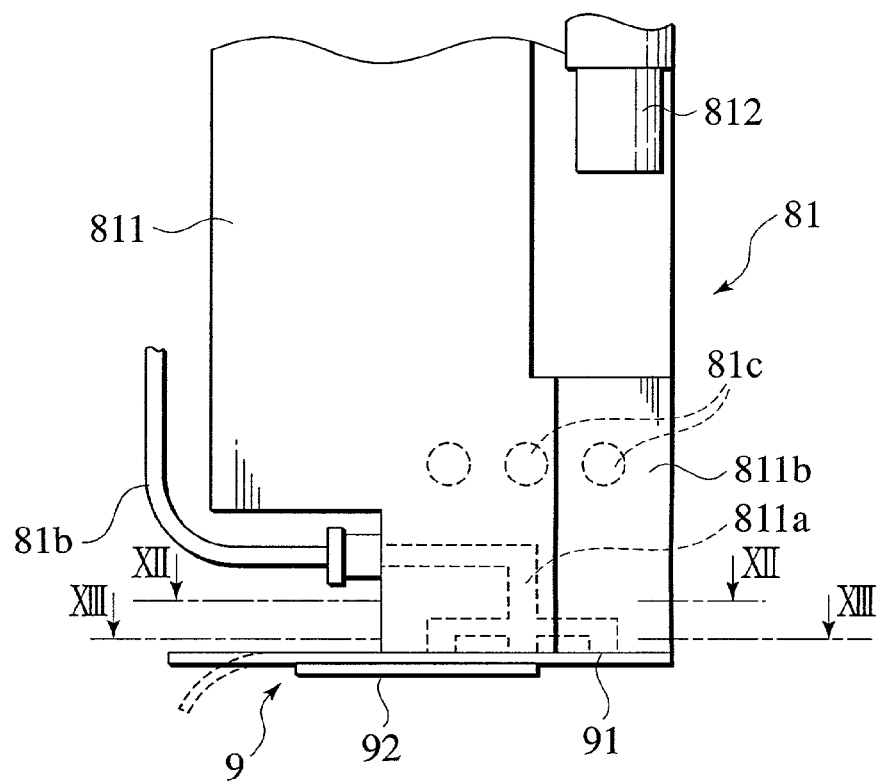
FIG. 11 is a partial front elevational view showing the component holding head of FIG. 9.
Figure 12:
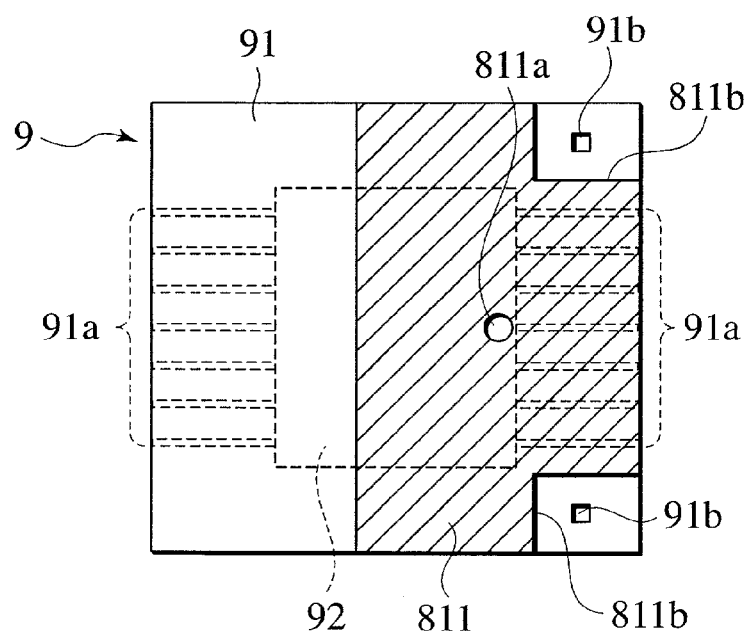
FIG. 12 is a cross-sectional view seen from the arrow directions of the line XII—XII in FIG. 11.
Figure 13:
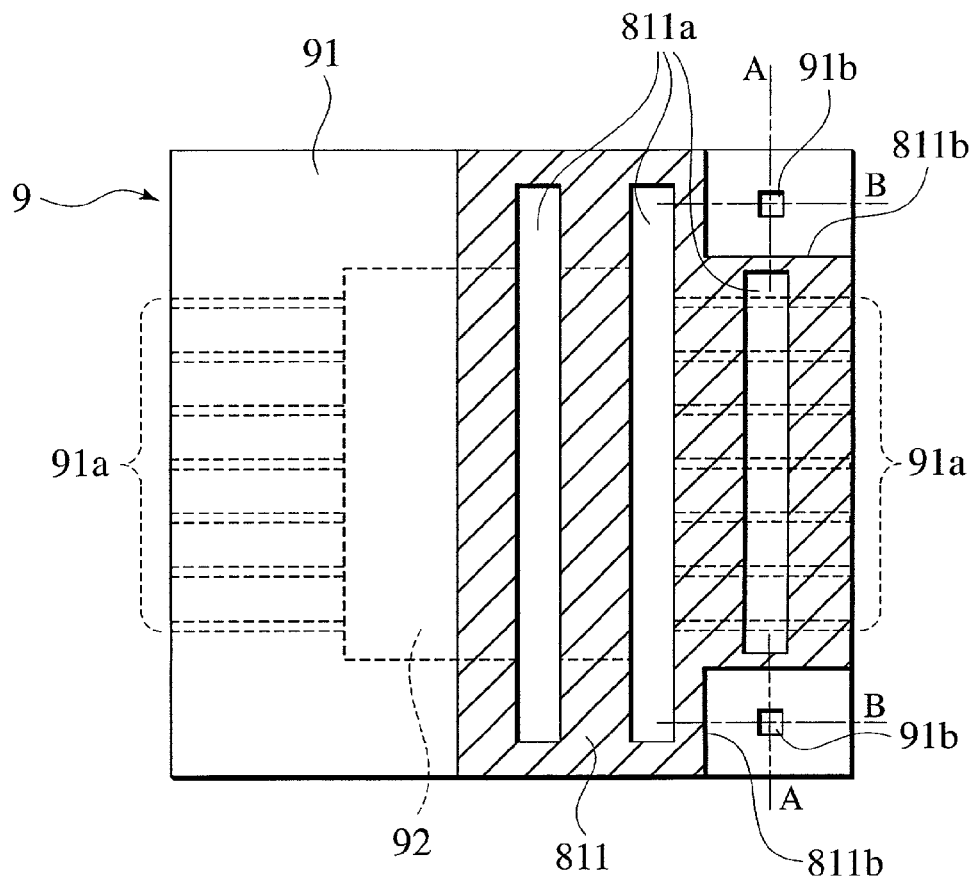
FIG. 13 is an enlarged cross-sectional view seen from the arrow directions of the line XIII—XIII in FIG. 11.
Figure 14:
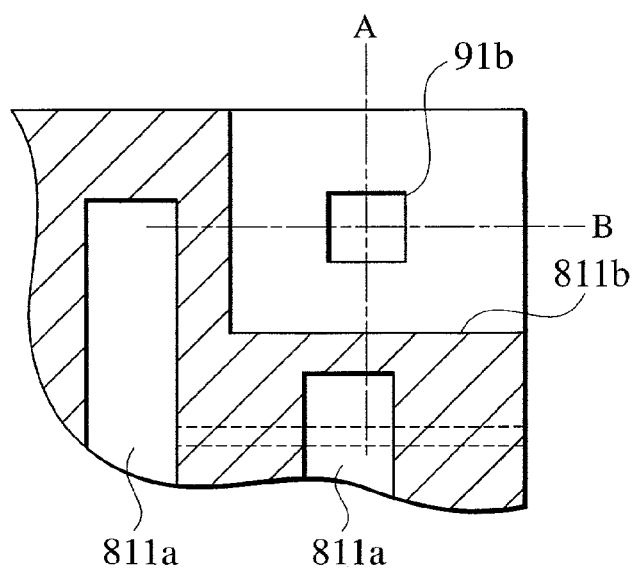
FIG. 14 is an enlarged view of FIG. 13.

FIG. 11 is a partial front elevational view of the component holding head shown in FIG. 9, FIG. 12 is a cross-sectional view of the component holding head shown in FIG. 11 from the arrow directions of the XII—XII line, FIG. 13 is an enlarged cross-sectional view of the component holding head shown in FIG. 11 from the arrow directions of the XIII—XIII line, and FIG. 14 is a enlarged view of FIG. 13.

As shown in FIG. 11 through FIG. 14, vacuum chucking holes 811a are provided in the block-shaped main holding unit 811 of the component holding head 81 facing toward the vacuum chucked surface of the electronic component 9, for the purpose of vacuum chuck holding of the electronic component 9. These vacuum chucking holes 811a, as shown in FIG. 11, are connected to a vacuum pump (not shown in the drawing) having an electromagnetic valve, via a pipe 81b.

In the first embodiment, the vacuum chucking holes 811a, as shown in FIG. 13 and FIG. 14, are disposed so as to hold the electronic component 9 by vacuum chucking and so as to be parallel to the peripheral edges of a rectangular electronic component 9 to be vacuum chuck held, and are located on or over straight lines A and B which are substantially orthogonal to each other on or over the positioning marks 91b, 91b, and further disposed at positions that avoid the positioning marks 91b, 91b.

Light path parts formed by cutout parts 811b, 811b are formed as cubic cutouts at corners of the main unit 811 of the component holding head 81, so that hollow spaces are formed which open upward so as to avoid the positioning marks 91b, 91b.

An illumination fixture (light source) 812 such as a lamp or the like is mounted in a fixed manner to the main holding unit 811 above the cutout parts 811b, 811b forming light paths, so that light is shined therefrom in the direction of the positioning marks 91b at the lower edge part of the cutout parts 811b.

Therefore, as shown in FIG. 13 and FIG. 14, by providing the cutout parts 811b, 811b of the main holding unit 811, it is possible to avoid the positioning marks 91b, 91b at both edges of the terminal parts of the electronic component 9 (that is, the vacuum chucking holes 811a do not vacuum chuck at the positioning marks 91b, 91b) while performing vacuum chuck holding of the film member (transparent film) 91 on or over the straight lines A and B, which are substantially orthogonal on the positioning marks 91b, 91b, so as to surround the film member 91.

For this reason, deformation of the film member 91 in the part in which the positioning marks 91b, 91b are formed is suppressed. As shown in FIG. 11, a heater 81c is buried in the main holding unit 811.

The component holding head 81 is configured as described above. Because the main holding unit 811 holds by vacuum chucking the vicinity region in which the positioning marks 91b, 91b are formed, so as to not provide room for the film member 91 to deform, as shown in FIG. 9 and FIG. 10, the imaging device (imaging means) 87 disposed below the substrate 2 receives light that passes via the light path through the positioning marks 91b, 91b which are substantially parallel to the surface of the substrate 2, thereby enabling the acquisition of a proper and accurate image of the positioning marks 91b, 91b having good contrast.

The electronic component 9 to be mounted on the substrate 2 has a chip component 92 on a transparent film member 91 made of a polyimide resin. When mounting the electronic component 9 to the substrate 2, the imaging device 87 forms an image of the positioning marks 91b of the film member 91 using transmitted light, and performs positioning of the electronic component 9 relative to the substrate 2 based on this image data. Alternatively, the imaging device 87 may forms an image of both of the positioning marks 91b and 2b.

The component holding head 81 according to the first embodiment has light paths formed by cutout parts 811b which are provided in the main holding unit 811 that holds the electronic component 9 by vacuum chucking, and has vacuum chucking holes 811a disposed in the region near to the positioning mark 91b so as to surround the positioning marks 91b. Therefore, deforming such as sagging of the film member 91 in the parts in which the positioning marks 91b are formed is avoided, thereby enabling mounting of the electronic component 9 to the substrate 2 with highly accurate positioning.

The first embodiment achieves the following effects. Specifically, according to a component holding head of the first embodiment, the electronic component is held by the component holding head at a position on a straight line on or over the positioning mark and parallel to an edge of the electronic component and also substantially mutually orthogonal and avoiding the positioning mark, thereby suppressing deformation of the positioning mark at the when holding the electronic component, and the imaging device uses transmitted light via the formed light paths to a clear and accurate positioning mark image with a high contrast.

Even in a case in which the film member 91 held by vacuum chucking is a thin film member, the component mounting apparatus 8 having the component holding head 81 suppresses deformation that can occur in the region of the positioning mark 91b of the electronic component 9, since vacuum chuck holding is done at a position on straight lines those are substantially orthogonal to each other on or over the positioning mark 91b. For this reason, the connection and mounting of the leads 91a can be performed properly, without the occurrence of misalignment, enabling the assembly and fabrication of a high-quality substrate with high accuracy.

In the first embodiment, in a case in which the substrate 2 is formed of transparent glass, the imaging device 87 receives light from the illumination fixture (light source) 812 of the component holding head 81 and forms an image therefrom. If the substrate 2 is formed from non-transparent material, however, as shown in FIG. 10 a light source 871 is attached to the imaging device 87, light supplied within a mirror tube of the imaging device 87 via an optical fiber 872 being shined onto the surface of the substrate 2 by an optics system from the downward direction, the reflected light therefrom being used to create an image of the positioning mark 2b of the substrate 2. In such case, the substrate 2 has the positioning mark 2b on the rear surface thereof.

In addition, in the first embodiment, the component holding head 81 has cutout parts 811b formed in it so that cubic cutouts are provided at the corner parts corresponding to the positioning marks 91b of the electronic component 9 that is held by vacuum chucking. Light from the illumination fixture 812 disposed thereabove, however, can be shined onto the positioning marks 91b of the vacuum chucked electronic component 9, and the cross-sectional shape of the light path part need not be rectangular, but can be a different polygon shape, circular, or elliptical.

Additionally, although in the first embodiment of the present invention as described above light is shone from directly above the positioning marks 91b, it is alternately possible to use an arrangement in which light is incident at an inclination with respect to the positioning mark 91b.

Second Embodiment

Figure 15:
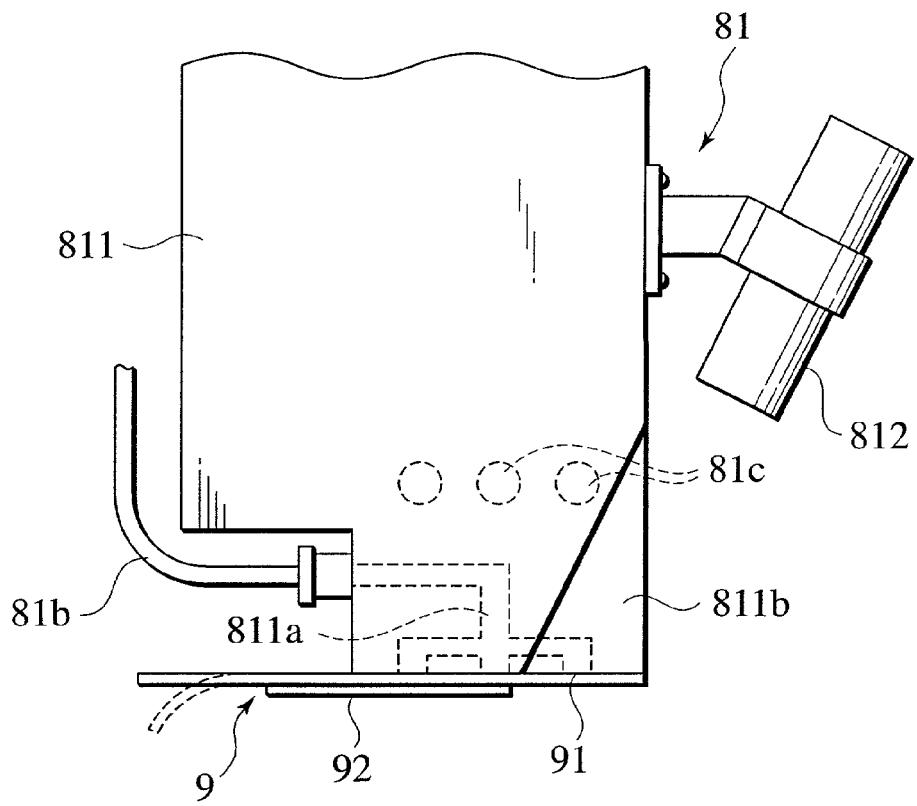
FIG. 15 is a front elevational view showing a component holding head according to a second embodiment of the present invention.
Figure 16:
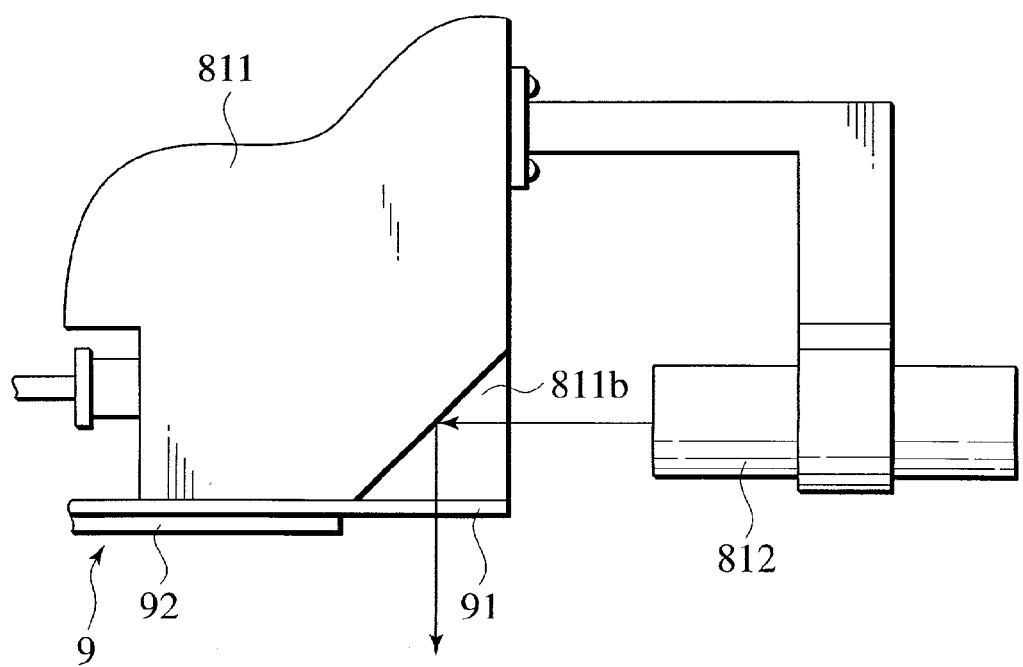
FIG. 16 is a front elevational view showing a variation of the component holding head according to the second embodiment of the present invention.
Figure 17:
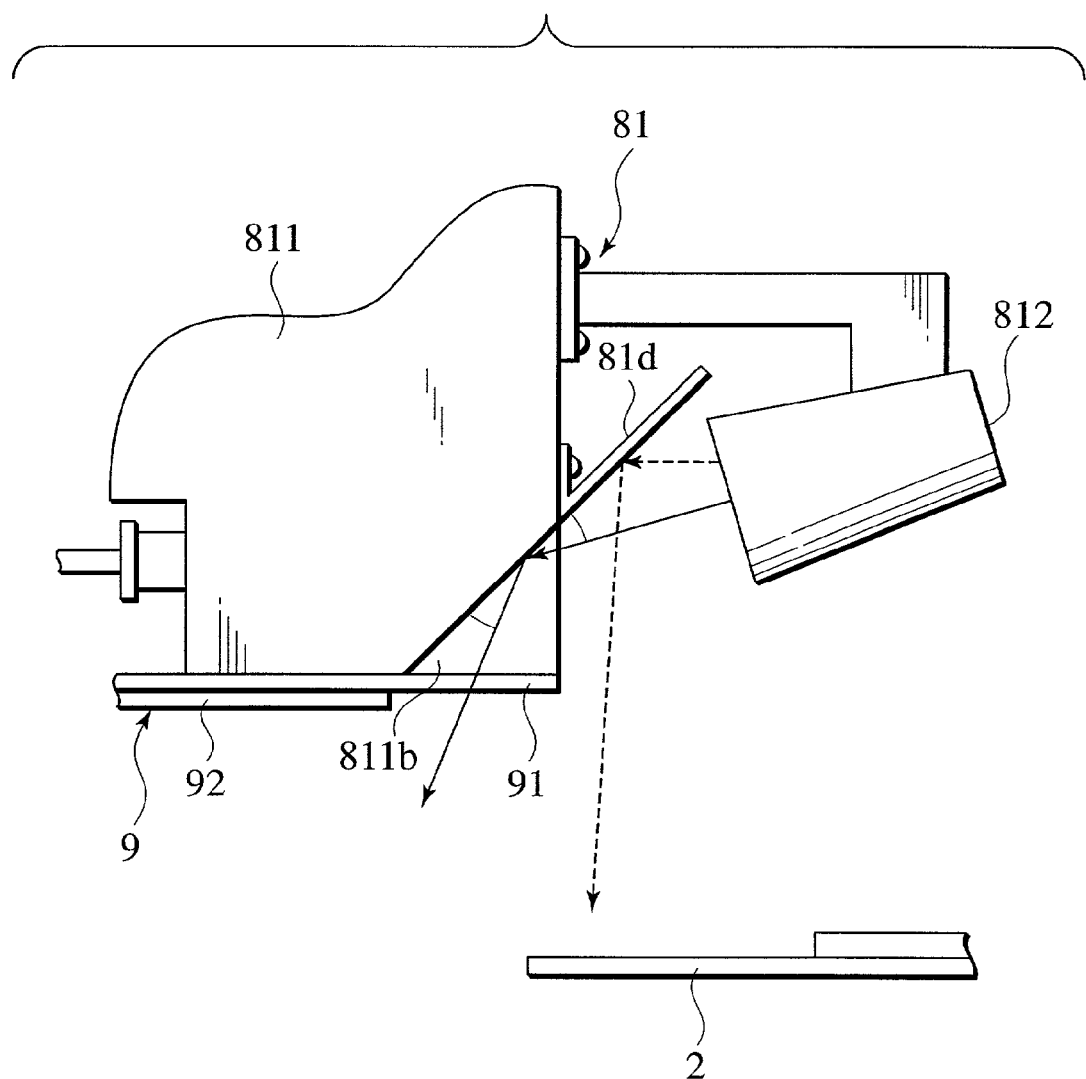
FIG. 17 is a front elevational view showing another variation of the component holding head according to the second embodiment of the present invention.

A component holding head, component mounting apparatus, and method for component mounting according to a second embodiment of the present invention is shown in FIG. 15 through FIG. 17, this embodiment being described below in detail, insofar as it differs from the first embodiment described above.

A component holding head 81 according to the second embodiment, in comparison to that of the first embodiment, can have the volume of the cutout parts 811b of the component holding head 81 reduced.

FIG. 15 is a partial front elevation showing component holding head according to the second embodiment of the present invention, in which light is shined onto the positioning mark 91b of a vacuum chucked electronic component 9 at an inclination.

As shown in FIG. 15, cutout parts 811b of the main holding unit 811 are formed with a taper in an inclined direction at the corners above the positioning marks 91b, so light from an illumination fixture 812 mounted fixed relative to the main holding unit 811 is shined onto the positioning marks 91b from an inclined direction.

Although in the configuration shown in FIG. 15 light from the illumination fixture 812 is directly shined onto the positioning marks 91b, 91b of a vacuum chucked electronic component 9, the second embodiment does not impose this as a restriction. For example, as shown in FIG. 16, it is possible to form a mirror surface on an inclined surface of the tapered cutout part 811b, so that light from the illumination fixture 812 is reflected thereby and shined onto the positioning mark 91b.

Additionally, as shown in FIG. 17, it is possible to have, in addition to a mirror surface on an inclined surface of the tapered cutout part 811b, a reflecting mirror 81d, which is formed to match the inclination of the inclined surface as an extension thereof, so that light from the illumination fixture 812 supported by and fixed to the component holding head 81 is shined onto the inclined surface of the cutout part 811b and onto the reflecting mirror 81d, the reflected light therefrom being shined onto the positioning mark 91b of the electronic component 9.

In the above case, it is also possible to adopt a configuration in which, as shown by the broken line in FIG. 17, illumination light from the illumination fixture 812 passes, shines also on the surface of the substrate 2 therebelow, via the reflecting mirror 81d, thereby achieving efficient utilization of the illumination light from the illumination fixture 812 and providing a savings in energy for the illumination fixture 812.

The second embodiment achieves the following effects. Specifically, because the main holding unit 811 achieves reliable vacuum chuck holding of the electronic component 9 in a region near a pair of positioning marks 91b, 91b enabling avoidance of deformation such as sagging or recurvation and the like of the film member 91, which includes the positioning marks 91b, 91b, it is possible to perform mounting and connection of the electronic component 9 to the substrate 2 with high accuracy.

According to the second embodiment, because it is possible to reduce the volume of the cutout parts 811b formed in the block-shaped component holding head 81, there is an increase in the degree of freedom of placement of, for example, a built-in heater 81c, thereby enabling efficient hot-press mounting.

Although in the foregoing first and second embodiments the component holding head 81 has light paths formed by cutout parts at the corners thereof corresponding to the positioning marks 91b of a vacuum chucked electronic component 9, it is alternatively rather than to provide cutout parts 811b, to provide through-hole apertures opening toward the positioning marks 91b of a vacuum chucked electronic component 9, light being shined via these through holes.

Third Embodiment

Figure 18:
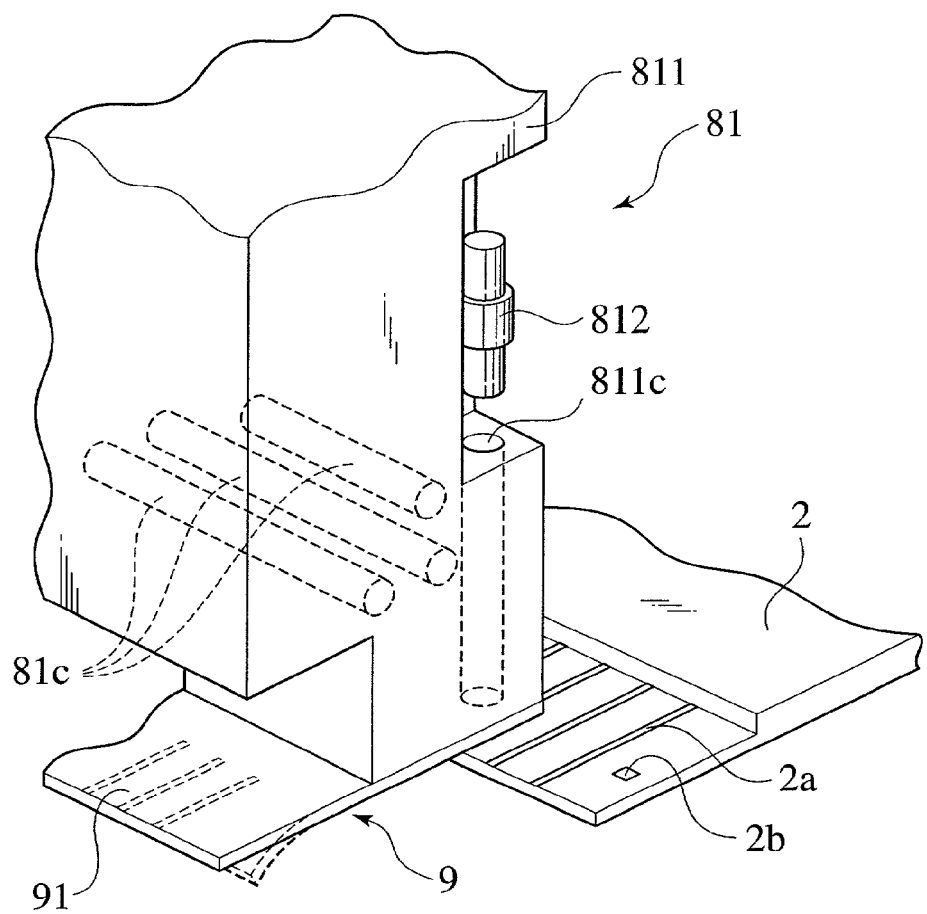
FIG. 18 is a partial oblique view showing a component holding head according to a third embodiment of the present invention.
Figure 19:
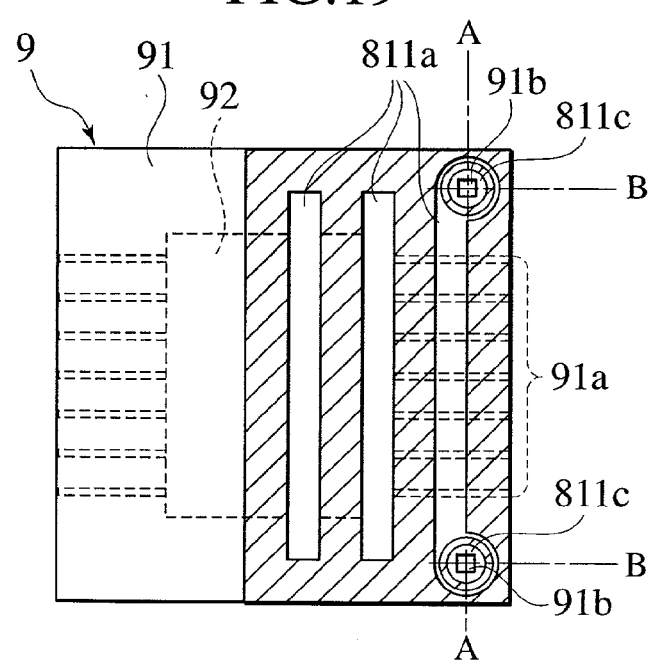
FIG. 19 is a cross-sectional view showing the component holding head of FIG. 18.

FIG. 18 and FIG. 19 shows a component holding head, a component mounting apparatus using same, and a method for component mounting according to a third embodiment of the present invention, which is described in detail below, to the extent that it differs from the above-described first and second embodiments.

The component holding head 81 according to the third embodiment, in comparison with that of the first and second embodiments, has vacuum chucking holes that vacuum chucks also at the corners of the film member 91 of the electronic component 9.

FIG. 18 is a partial oblique view showing a component holding head according to the third embodiment of the present invention, in which a through hole corresponding to a positioning mark of a vacuum chucked electronic component 9 is provided as a light path, and FIG. 19 is a cross-sectional view of FIG. 18.

As shown in FIG. 18, a through hole 811c forming a light path is provided at the terminal part corner on side of the component holding head 81 from which the electronic component 9 is vacuum chucked. This through hole 811c, as shown in FIG. 19, is opened toward the positioning mark 91b of the vacuum chucked electronic component 9.

As shown in FIG. 19, holes provided so as to annularly surround the outside of the thus opened up through hole 811c and also so as to open toward the vacuum chucked electronic component 9, these holes being formed so as to connected with the vacuum chucking hole 811a.

Additionally, as shown in FIG. 18, similar to the cases of the first and second embodiments, an illumination fixture 812 is mounted fixed relative to the main holding unit 811, over the top aperture of the through hole 811c, light from the illumination fixture 812 passing through the through hole 811c and striking the positioning mark 91b of the vacuum chucked electronic component 9.

The third embodiment achieves the following effects. Specifically, because it is possible with the third embodiment to form an image of the positioning mark 91b using transmitted light and without deformation of the film member 91 in the area surrounding the positioning mark 91b, it is possible to perform high-accuracy mounting and connection to the substrate 2.

In particular, because in the third embodiment holes connecting with the vacuum chucking hole 811a are provided around the through hole 811c serving as the light path so as to open up toward the vacuum chucking surface, the film member 91 in the area centering around the positioning mark 91b is held to the main holding unit 811 by vacuum chucking, so that there is more precise avoidance of deformation of the positioning mark 91b, enabling high-accuracy positioning.

That is, in the third embodiment of the present invention as well, similar to the cases of the first and second embodiments, the substantially mutually orthogonal straight lines A and B parallel to edges of the electronic component 9 exist on or over the positioning marks 91b formed on the electronic component 9, and the electronic component 9 is held at positions that avoid the positioning marks 91b.

Additionally, in the third embodiment a straight line A or straight line B traverses over the positioning mark 91b, and vacuum chucking holes 811a of the component holding head 81 are formed on both outer sides of the positioning marks 91b so as to surround and avoid the positioning mark 91b, the film member 91 being thereby held. For this reason, deformation such as sagging or warping of the film member 91 is properly prevented, enabling the acquisition of image data for the positioning mark 91b with improved accuracy.

It will be understood that, although in the third embodiment the vacuum chucking holes 811a are formed so as to annularly surround the positioning mark 91b, there is no restriction to this annular shape. That is, the same type of effect can be achieved by provided vacuum chucking holes 811a in a point arrangement on both sides of a straight line traversing the positioning marks 91b, holding being done so as to raise up the intermediate positioning mark 91b.

Furthermore, although in the foregoing third embodiment the through hole 811c forming the light path is formed so as to be perpendicular to the vacuum chucked surface, the through hole can be alternatively provided at an inclination, and the cross-sectional shape thereof can be a polygon such as a rectangular shape.

Additionally, in the above-described first to third embodiments, the descriptions were for cases in which the lighting fixture 812 was mounted in a fixed manner to the main holding unit 811, the present invention does not impose this as a restriction. Because it is sufficient that transmitted light via the light path be shined onto the positioning mark 91b of the vacuum chucked electronic component 9, it is alternatively possible to provide the illumination fixture 812 separately from the main holding unit 811. In a case in which the surface of the positioning mark 91b is sufficiently bright, enabling the acquisition of transmitted light therefrom, it is possible to omit the illumination fixture 812.

According to each of the above-described embodiments of the present invention, electronic component 9 vacuum chucked by the component holding head 81, based on control performed by the controller 86, can be accurately positioned relative to the substrate 2, by means of driving an X-Y coordinate system transport arm 83, by X-Y direction drive, and by θ-direction drive of a shaft about the Z axis, so as to drive a substrate placement stage 84.

In performing positioning in accordance with the above-described embodiments of the present invention, in order to mount a microfine electronic component 9 with greater accuracy to the surface of the substrate 2, it is desirable, as shown in FIG. 12 and FIG. 13, that the orientation of the component holding head 81 and the orientation of the electronic component 9 coincide, and that edge surrounding the component holding head 81 and the edge that surrounds the electronic component 9 be pre-aligned. For this reason, it is preferable the component holding head 81 be pre-positioned and then the electronic component 9 placed on the table 85 be held by vacuum chucking.

Figure 20:
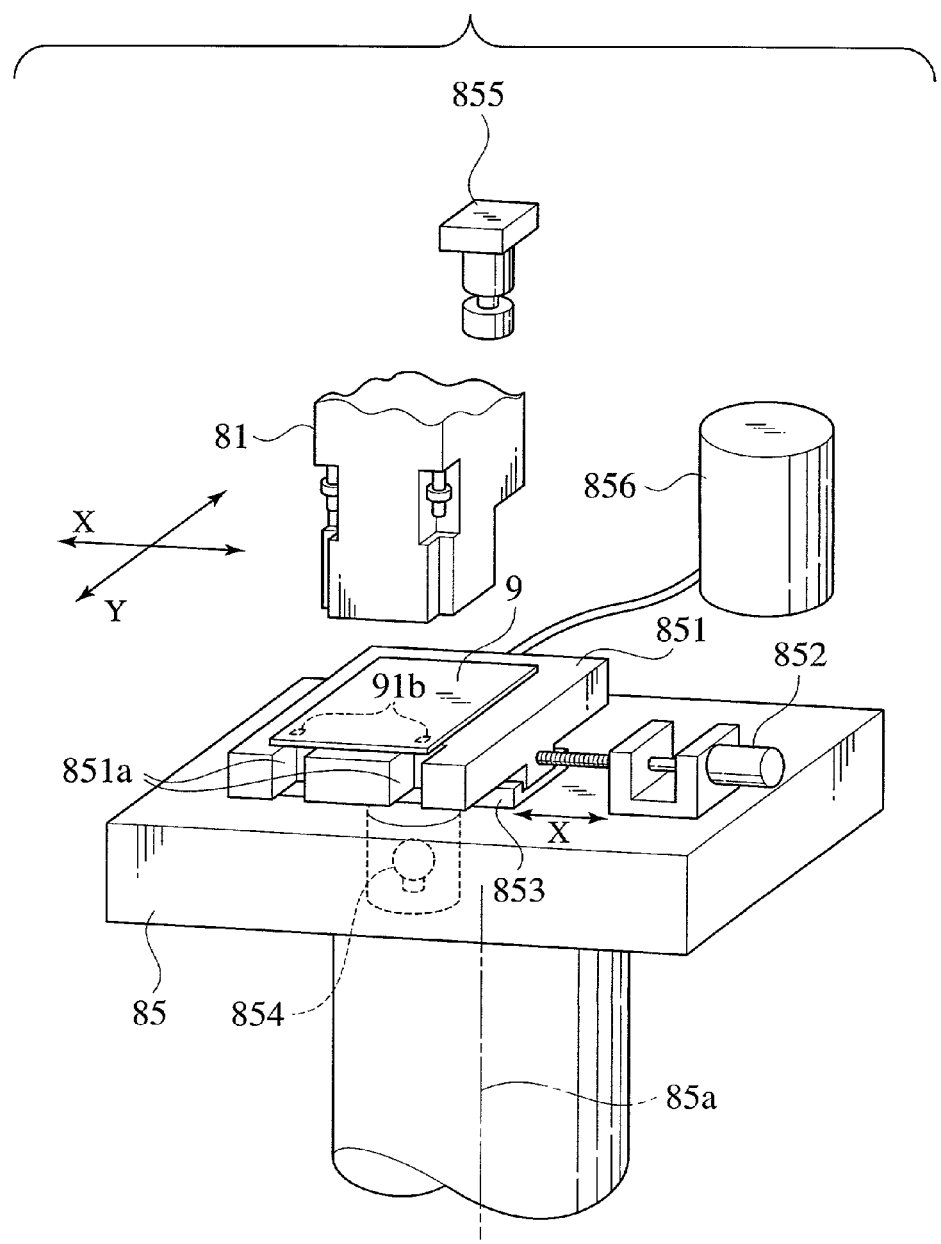
FIG. 20 is drawing showing details of the configuration of the table 85 shown in FIG. 9.

FIG. 20 is a drawing showing a general configuration illustrating the component holding head 81 linked to the transport arm 83 vacuum chucking and holding the electronic component 9 positioned on the table 85 at a proper position and attitude.

Next, the procedure for mounting an electronic component using the positioning processing of the foregoing embodiments is described below.

As shown in FIG. 20, a receiving stage 851 on the table 85 to which is vacuum chucked an electronic component 9 is disposed so that, by being driven by a ball screw mechanism 852 that can move in the arrow X direction along the guide rail 853.

An illumination fixture 854 is buried into the table 85 so as to illuminate the positioning mark 91b of the electronic component 9 at the above, via the cutout part 851a of the receiving stage 851. Above the illumination fixture 854 is disposed an imaging camera 855, such as a CCD camera or the like, in opposition to the illumination fixture 854.

The receiving stage 851 is provided with a vacuum chucking hole via which the electronic component 9 placed thereon is vacuum chucked, this vacuum chucking being freely engaged and released by means of a vacuum pump 856.

In the above-noted configuration, by first causing the receiving stage 851 to move by means of the ball screw mechanism 852, one of the cutout parts 851a is positioned between the illumination fixture 854 and the imaging camera 855. The imaging camera 855 forms an image of the positioning mark 91b positioned opposite the one cutout part 851a, the video signal thereof being sent to the controller 86 shown in FIG. 9. Based on the video signal from the imaging camera 855, the controller 86 calculates the X-Y direction position offset of the positioning mark 91b relative to a pre-established reference position.

Next, by the ball screw mechanism 852 causing the movement of the receiving stage 851, the other cutout part 851a is positioned between the illumination fixture 854 and the imaging camera 855.

The imaging camera 855 then forms an image of the positioning mark 91b positioned opposite the other cutout part 851a, and sends this video signal to the controller 86 shown in FIG. 9. The controller 86, based on the video signal from the imaging camera 855, calculates the X-Y direction position offset of the positioning mark 91b relative to a reference position and, based on the thus determined position offset information for the both positioning marks 91b, 91b, calculates the X-Y direction and θ-direction position offsets of the electronic component 9.

After the above, the controller 86 performs control of the transport arm 83 so as to correct the calculated X-Y-θ direction position offsets of the electronic component 9, thereby positioning the component holding head 81 over the electronic component 9 on the receiving stage 851, so that the electronic component 9 is vacuum chucked at a proper position and attitude. In doing this, the controller 86 controls the holding and release of vacuum chucking by means of the vacuum pump 856 in synchronization with the vacuum chucking and transporting operation of the component holding head 81.

According to the operation of various mechanisms as described above, it is possible to hold the electronic component 9 by the component holding head 81 at a proper position and attitude. For this reason, the size of the cutout parts 811*b* serving as the light paths in the component holding head 81 can be established without hardly an consideration given to the relative position offset between the component holding head 81 and the electronic component 9.

For example, in the case in which the positioning mark 91*b* is rectangular, as shown in FIG. 12, the size of the cutout part 811*b* can be established to the minimum size required as a transmission region in the region surrounding the positioning mark 91*b*. For this reason, it is possible to dispose the vacuum chucking hole 811*a* at a position close to the positioning mark 91*b* and, as a result, it is possible to effectively prevent deformation of the film member 91 in the region surrounding the positioning mark 91*b*.

Figure 21:
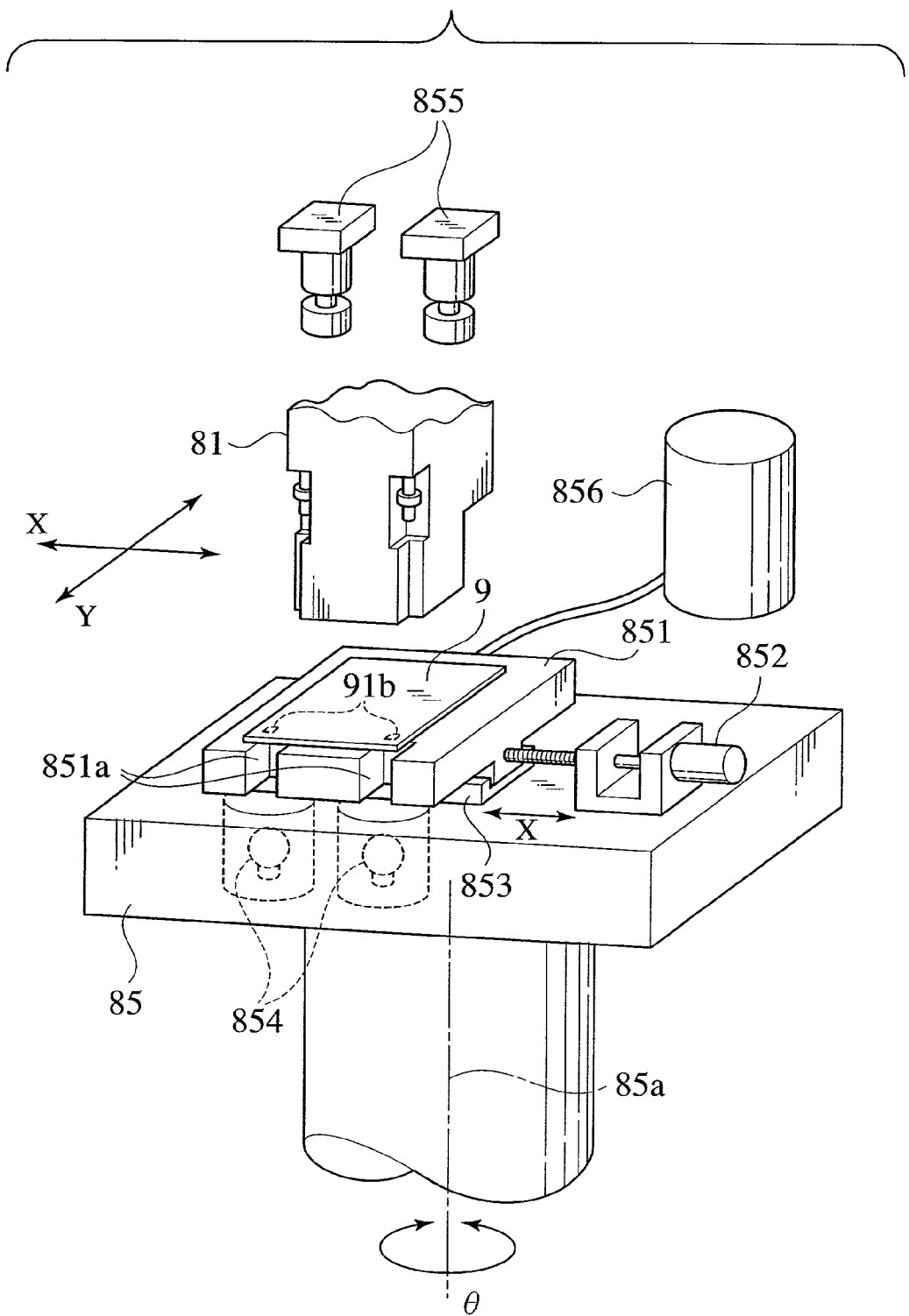
FIG. 21 is a drawing showing details of the table 85 show in FIG. 9.

FIG. 21 is a drawing showing the general configuration, illustrating the condition of positioning using another example of a table 85. In FIG. 21, elements similar to elements in FIG. 20 are assigned the same reference numerals.

As shown in FIG. 21, it is possible to perform rotational control of the table 85 in the θ direction around the axis of 85*a*, the receiving stage 851 onto which the electronic component 9 is held by vacuum chucking being drivable by the ball screw mechanism 852 on the table 85 so as to perform fine control of movement in the arrow X direction along the guide rail 853.

Illumination fixtures 854, 854 are buried into the table 85 so as to shine light onto the positioning mark 91*b* of the electronic component 9 thereabove, via the cutout part 851*a* of the receiving stage 851. Imaging cameras 855, 855, which form images of the positioning mark 91*b* are provided so as to rotate in concert with the table 85. Alternatively, the imaging cameras 855, 855 may be fixed to a main unit of the apparatus of the embodiment.

The receiving stage 851 is provided with a vacuum chucking hole that holds the electronic component 9 placed thereon, the holding and releasing of this vacuum chucking being freely controlled by the vacuum pump 856.

According to the above-described configuration, upon receiving video signals from the imaging cameras 855, 855, the controller 86 shown in FIG. 9 controls the drive of the ball screw mechanism 852 so as to obtain a proper image, while adjusting the θ-direction rotation of the table 85.

Next, the controller 86 controls the component holding head 81 which moves in the X and Y directions, so as to raise or lower the position thereof and holds the electronic component 9 onto the receiving stage 851 by vacuum chucking. When doing this, the controller 86 controls the holding and release of vacuum chucking by means of the vacuum pump 856 in synchronization with the vacuum chucking and transporting operation of the component holding head 81.

Although in the foregoing description the table 85 θ direction rotational adjustment is made, it is alternatively possible to rotationally adjust the θ direction of the component holding head 81 linked to the transport arm 83.

According to component holding head, a component mounting apparatus using same, and a method for mounting components according to the present invention, when mounting an electronic component 9, such as a TCP having a transparent film or the like as a film member 91, onto a substrate 2 or the like, because deformation of the transparent film on which are formed positioning marks 91*b* is avoided, and high-contrast image data is obtained, it is possible to achieve a superior effect when applied to the fabrication of a liquid crystal panel or the like.

That is, the component holding head holds an electronic component above a straight lines parallel to the edges of the electronic component and substantially mutually orthogonal or above a straight line traversing the positioning marks, thereby avoiding the positioning marks themselves. It is therefore possible to avoid deformation of the positioning marks when holding the electronic component, and possible for an imaging device to obtain, using light transmitted via a light path formed in the main holding unit, to obtain a clear, high-contrast image of the positioning mark.

Because the component holding head 81 has an imaging device which forms an image of the positioning mark of the held electronic component held without deformation by the component holding head, and mounts the electronic component to the substrate upon performing position compensation based on the resulting image data, it is possible to perform mounting with high accuracy, to avoid misalignment at the time of pressure application, and to improve the manufacturing yield.

It will be understood that the present invention is not restricted to the above-described embodiments, which are merely provided as examples, and can take on other forms and variations within the technical scope of the present invention.

In summary, a component holding head, component mounting apparatus using same, and a method for component mounting according to the above embodiments of the present invention can avoid deformation such as sagging or warping in the region surrounding the positioning mark of the electronic component in performing mounting to a substrate, thereby achieving component mounting with high accuracy and good electrical characteristics, this being highly effective in actual application.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic component holding head for holding an electronic component to be mounted to a substrate, comprising:

a main electronic component holding unit said main electronic component holding unit having a vacuum chuck provided so as to face the surface of the electronic component to be held by vacuum chucking holes of said vacuum chuck, so that the electronic component is held by vacuum chucking holes to said main electronic component holding unit; and a light path part provided in the main electronic component holding unit, the light path part being configured to guide light shined onto a positioning mark formed at a terminal part of the electronic component to correct a position offset between the electronic component and a substrate to which the electronic component is to be mounted, wherein said vacuum chuck hold the electronic component at a position which is on straight lines substantially parallel to more than two edges of the electronic component respectively and substantially perpendicular to the positioning mark of the electronic component, said vacuum chucking holes partially covering the electronic component, being located in a vicinity of the positioning mark and avoiding the positioning mark so as to hold substantially all portions of the electronic component in engagement with said main electronic equipment holding unit.

2. The electronic component holding head according to claim 1, further comprising:
a light source provided on said main electronic component holding head, which shines light toward the positioning mark formed on the electronic component held by said vacuum chuck, via said light path part.

3. The electronic component holding head according to claim 1, wherein
said light path part is a rectangular solid cutout part at a corner of said main electronic component holding unit.

4. The electronic component holding head according to claim 1, wherein
said light path part is a tapered cutout part at a corner of said main electronic component holding unit.

5. The electronic component holding head according to claim 4, further comprising:
a light source provided on said main electronic component holding unit, which shines light toward the positioning mark formed on the electronic component held by said vacuum chuck, via said light path part, wherein
an inclined surface of the cutout part is formed as a reflecting mirror surface, and light emanating from the light source is shined onto the positioning mark from the reflecting mirror surface.

6. The electronic component holding head according to claim 1, wherein
said light path part is a through hole provided in said main electronic component holding unit, which opens toward the positioning mark of the electronic component.

7. The electronic component holding head according to claim 6, wherein
said vacuum chucking holes are annularly formed around the outer periphery of the through hole.

8. The electronic component holding head according to claim 1, wherein said positioning mark comprises a plurality of positioning marks and wherein said vacuum chucking holes extend between adjacent positioning marks of said plurality of positioning marks.

9. An electronic component mounting apparatus for mounting an electronic component onto a substrate, comprising:
an electronic component feeding unit, which feeds an electronic component;
an electronic component holding head, which holds the electronic component to be mounted onto a substrate;
an imaging unit, which forms an image of a positioning mark formed at a terminal part of the electronic component held by said electronic component holding head, for correcting a position offset between the electronic component and the substrate to which the electronic component is to be mounted;
a position offset detection unit, which detects a position offset of the electronic component relative to the substrate, based on image data of the positioning mark obtained by said imaging unit;
a position correction unit which, based on the position offset detected by said position offset detection unit, performs control so as to correct the X direction and the Y direction position offset of the electronic component relative to the substrate, so that the electronic component with the thus corrected position offset is mounted to the substrate, wherein
said electronic component holding head includes:
a main electronic component holding unit;
vacuum chuck provided on said main electronic component holding unit so as to face the surface of the electronic component to be held by vacuum chucking holes of said vacuun chucking, so that the electronic component is held by vacuum chucking holes to said main electronic component holding unit; and
a light path part provided in the main electronic component holding unit, the light path part being configured to guide light shined onto the positioning mark formed at a terminal part of the electronic component to correct a position offset between the electronic component and the substrate to which the electronic component is to be mounted, wherein
said vacuum chuck hold the electronic component at a position which is on straight lines substantially parallel to more than two edges of the electronic component respectively and substantially perpendicular to the positioning mark of the electronic component, said vacuum chucking holes partially covering the electronic component, said vacuum chucking holes being located in a vicinity of the positioning mark and avoiding the positioning mark so as to hold substantially all portions of the electronic component in engagement with said main electronic equipment holding unit.

10. The electronic component mounting apparatus according to claim 9, further comprising:
a receiving stage onto which the electronic component fed from said electronic component feeding unit; and
a second imaging unit forms an image of the positioning mark of the electronic component placed on said receiving stage.

11. The electronic component holding head according to claim 9, wherein said positioning mark comprises a plurality of positioning marks and wherein said vacuum chucking holes extend between adjacent positioning marks of said plurality of positioning marks.

12. A method of mounting an electronic component to a substrate, comprising:
feeding an electronic component;
forming an image of a positioning mark for compensation of a position offset between the electronic component and the substrate to which the electronic component is to be mounted;
detecting a position offset of the electronic component relative to the substrate, based on the image data of the positioning mark;
correcting the X direction and Y direction position offset of the electronic component relative to the substrate, based on the detected position offset; and holding a position offset corrected electronic component by said electronic component holding head and mounting the electronic component to the substrate, wherein said electronic component holding head includes:

a main electronic component holding unit;

said main electronic component holding unit having a vacuum chuck provided on said main electronic component holding unit so as to face the surface of the electronic component to be held by vacuum chucking holes of said vacuun chucking, so that the electronic component is held by vacuum chucking holes to said main electronic component holding unit; and a light path part provided in the main electronic component holding unit, the light path part being configured to guide light shined onto the positioning mark formed at a terminal part of the electronic component to correct a position offset between the electronic component and the substrate to which the electronic component is to be mounted, wherein said vacuum chuck hold the electronic component at a position which is on straight lines substantially parallel to more than two edges of the electronic component respectively and substantially perpendicular to the positioning mark of the electronic component, said vacuum chucking holes partially covering the electronic component, said vacuum chucking holes being located a vicinity of the positioning mark and avoiding the positioning mark so as to hold substantially all portions of the electronic component in engagement with said main electronic equipment holding unit.

13. The electronic component holding head according to claim 12, wherein said positioning mark comprises a plurality of positioning marks and wherein said vacuum chucking holes extend between adjacent positioning marks of said plurality of positioning marks.

\* \* \* \* \*